（12）United States Patent
Suzuki

(10) Patent No.: US 10,593,459 B2
(45) Date of Patent: Mar. 17, 2020

(54) MAGNETORESISTANCE EFFECT DEVICE AND MAGNETORESISTANCE EFFECT MODULE

(71) Applicant: TDK CORPORATION, Tokyo (JP)

(72) Inventor: Tsuyoshi Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/306,935

(22) PCT Filed: Sep. 14, 2017

(86) PCT No.: PCT/JP2017/033208
§ 371 (c)(1),
(2) Date: Dec. 4, 2018

(87) PCT Pub. No.: WO2018/052062
PCT Pub. Date: Mar. 22, 2018

(65) Prior Publication Data
US 2019/0148046 A1    May 16, 2019

(30) Foreign Application Priority Data
Sep. 14, 2016   (JP) .................................. 2016-179124

(51) Int. Cl.
*H01F 10/32*   (2006.01)
*H01L 43/08*   (2006.01)
(Continued)

(52) U.S. Cl.
CPC ......... *H01F 10/329* (2013.01); *H01F 10/324* (2013.01); *H01L 27/222* (2013.01);
(Continued)

(58) Field of Classification Search
CPC ................................ H01F 10/32; H01F 10/329
See application file for complete search history.

(56) References Cited

U.S. PATENT DOCUMENTS 7,471,491 B2 * 12/2008  Sato ...................... B82Y 25/00
                                                       257/E43.004
7,727,409 B2 *  6/2010  Maehara ................ H01L 43/08
                                                       216/22
(Continued)

FOREIGN PATENT DOCUMENTS

| JP | 2014-045196 A | 3/2014 |
| JP | 2017-063397 A | 3/2017 |
| WO | 2007/032149 A1 | 3/2007 |

OTHER PUBLICATIONS

Dec. 12, 2017 International Search Report issued in International Patent Application No. PCT/JP2017/033208.
(Continued)

*Primary Examiner* — Hai L Nguyen
(74) *Attorney, Agent, or Firm* — Oliff PLC

(57) ABSTRACT

A magnetoresistance effect device includes: a first magnetoresistance effect element including a first ferromagnetic layer, a second ferromagnetic layer, and a first spacer layer, a metal layer, a first electrode, an input terminal, an output terminal, and a reference potential terminal, wherein the first ferromagnetic layer, the first spacer layer, the second ferromagnetic layer, and the first electrode are disposed in this order, the second ferromagnetic layer is in electrical contact with the first electrode, which is connected to the output terminal configured to output a high-frequency signal, the metal layer is connected to the input and reference potential terminals so that a high-frequency signal flowing from the input terminal to the metal layer flows to the reference potential terminal, which is in electrical contact with the first ferromagnetic layer, and the first magnetoresistance effect element has an application terminal configured to apply a DC current or a DC voltage.

22 Claims, 7 Drawing Sheets

(51) Int. Cl.
*H01L 27/22* (2006.01)
*H03H 2/00* (2006.01)
*H03H 11/04* (2006.01)
*H01L 43/02* (2006.01)

(52) U.S. Cl.
CPC .............. *H01L 43/08* (2013.01); *H03H 2/00* (2013.01); *H03H 11/04* (2013.01); *H01F 10/3254* (2013.01); *H01F 10/3286* (2013.01); *H01L 43/02* (2013.01)

(56) References Cited

U.S. PATENT DOCUMENTS

| | | | |
|---|---|---|---|
| 10,439,592 B2* | 10/2019 | Degawa | H03F 15/00 |
| 2014/0056060 A1 | 2/2014 | Khvalkovskiy et al. | |
| 2016/0277000 A1 | 9/2016 | Shibata et al. | |

OTHER PUBLICATIONS

A.A. Tulapurkar et al. "Spin-Torque Diode Effect in Magnetic Tunnel Junctions". Nature, vol. 438, No. 7066, Nov. 17, 2005, pp. 339-342.

K. Konishi et al. "Radio-Frequency Amplification Property of the MgO-Based Magnetic Tunnel Junction Using Field-Induced Ferromagnetic Resonance". Applied Physics Letters, 2013, vol. 102, pp. 162409-1 through 162409-4.

* cited by examiner

MAGNETORESISTANCE EFFECT DEVICE AND MAGNETORESISTANCE EFFECT MODULE

TECHNICAL FIELD

The present invention relates to a magnetoresistance effect device and a magnetoresistance effect module using a magnetoresistance effect element.

Priority is claimed on Japanese Patent Application No. 2016-179124, filed Sep. 14, 2016, the content of which is incorporated herein by reference.

BACKGROUND ART

In recent years, high-speed wireless communication has advanced as mobile communication terminals such as cellular phones have become more complex. Since a communication speed is proportional to a bandwidth of a frequency to be used, a frequency band necessary for communication has increased. Accordingly, the number of high-frequency filters necessary for the mobile communication terminals has increased.

Further, spintronics has been studied as a field that may be applied to new high-frequency components in recent years. One of phenomena gaining attention regarding this is a spin torque resonance phenomenon using a magnetoresistance effect element (see Non-Patent Document 1).

When an AC current flows to a magnetoresistance effect element and a magnetic field is applied by a magnetic field application mechanism, a spin torque resonance can be generated in the magnetoresistance effect element. At this time, a resistance value of the magnetoresistance effect element periodically oscillates at a frequency according to a spin torque resonance frequency. The spin torque resonance frequency of the magnetoresistance effect element changes in accordance with the strength of the magnetic field applied to the magnetoresistance effect element and the resonance frequency of the magnetoresistance effect element is generally within a high frequency band of several to several tens of GHz.

CITATION LIST

Non-Patent Literature

Non-Patent Document 1
Nature, Vol. 438, No. 7066, pp. 339-342, 17 Nov. 2005

SUMMARY OF INVENTION

Technical Problem

As described above, a high-frequency oscillator using the spin torque resonance phenomenon has been studied. However, detailed configurations of other applications for the spin torque resonance phenomenon have not yet been examined sufficiently.

The present invention has been made in view of the above-described problems and an object of the present invention is to provide a structure allowing a magnetoresistance effect device and a magnetoresistance effect module using a spin torque resonance phenomenon to serve as a high-frequency filter or an amplifier.

Solution to Problem

In order to solve the above-described problems, the present invention has found that a magnetoresistance effect device and a magnetoresistance effect module using a spin orbit torque resonance phenomenon serve as a high-frequency filter or an amplifier.

That is, the present invention provides the following means in order to solve the above-described problems.

A magnetoresistance effect device according to a first aspect of the present invention includes: a first magnetoresistance effect element which includes a first magnetization free layer, a first magnetization fixed layer, and a first spacer layer; a metal layer; a first electrode; an input terminal; an output terminal; and a reference potential terminal, wherein the metal layer, the first magnetization free layer, the first spacer layer, the first magnetization fixed layer, and the first electrode are disposed in this order, wherein the first magnetization fixed layer is in electrical contact with the first electrode, wherein the first electrode is connected to the output terminal configured to output a high-frequency signal, wherein the metal layer includes a first region which is overlapped with the first magnetization free layer when viewed from a lamination direction of the first magnetization free layer, wherein the metal layer is connected to the input terminal and the reference potential terminal so that a high-frequency signal flowing from the input terminal to the metal layer flows to the reference potential terminal through the first region, and wherein the first magnetoresistance effect element is provided with an application terminal configured to apply a DC current or a DC voltage.

In the magnetoresistance effect device according to this aspect, a signal flows from the input terminal to the first region of the metal layer to generate a spin Hall effect and a spin-polarized spin current is injected to the first magnetization free layer. The spin-polarized spin current serves as spin orbit torque in the magnetization of the first magnetization free layer and changes the magnetization direction of the first magnetization free layer. At this time, since the high-frequency signal flows to the metal layer, the direction of the spin injected to the first magnetization free layer changes at the high frequency. When the high-frequency signal has the same frequency as the resonance frequency of the first magnetization free layer, the magnetization of the first magnetization free layer resonates and strongly oscillates. Since the magnetization of the first magnetization free layer strongly oscillates, the relative angle between the magnetization of the first magnetization free layer and the magnetization of the first magnetization fixed layer oscillates and the resistance value of the first magnetoresistance effect element oscillates at the same frequency as that of the high-frequency signal. The oscillating resistance becomes an AC signal due to a DC current or a DC voltage applied to the first magnetoresistance effect element and is output to the output terminal. When the frequency of the high-frequency signal is distant from the resonance frequency of the first magnetization free layer, the magnetization of the first magnetization free layer does not strongly oscillate due to the spin-polarized spin current and the first magnetoresistance effect element does not generate the AC signal described above. Thus, the magnetoresistance effect device serves as a band pass filter which transmits a signal of the resonance frequency and attenuates a signal away from the resonance frequency.

Further, in the magnetoresistance effect device according to this aspect, the impedance of the first magnetoresistance effect element may be higher than the impedance of the metal layer.

According to this magnetoresistance effect device, since the high-frequency signal flows from the metal layer to the reference potential terminal to a greater extent, the first magnetoresistance effect element does not easily break even when a high-frequency signal having a high strength is input to the magnetoresistance effect device and the magnetoresistance effect device serves as a band pass filter according to a case in which input power is large. Further, since the high-frequency signal flows to the reference potential terminal to a greater extent, cutoff characteristics outside the band are improved.

Further, the magnetoresistance effect device according to this aspect may further include a frequency setting mechanism which is able to change a resonance frequency of the first magnetoresistance free layer.

According to this magnetoresistance effect device, since the resonance frequency of the first magnetization free layer is changed by the frequency setting mechanism, the magnetoresistance effect device serves as a frequency variable band cutoff filter.

Further, the magnetoresistance effect device according to this aspect may further include a second magnetoresistance effect element, wherein the second magnetoresistance effect element includes a second magnetization free layer, a second spacer layer, and a second magnetization fixed layer, wherein the metal layer, the second magnetization free layer, the second spacer layer, the second magnetization fixed layer, and the first electrode are disposed in this order, wherein the metal layer includes a second region which is overlapped with the second magnetization free layer when viewed from a lamination direction of the second magnetization free layer, and wherein the metal layer is connected to the input terminal and the reference potential terminal so that a high-frequency signal flowing from the input terminal to the metal layer flows to the reference potential terminal through the second region.

According to this magnetoresistance effect device, since the magnetization free layers of the plurality of magnetoresistance effect elements are resonated by the high-frequency signal, a higher AC signal is generated and hence the strength of the signal output from the magnetoresistance effect device is improved.

Further, in the magnetoresistance effect device according to this aspect, the resonance frequencies of the first magnetization free layer and the second magnetization free layer may be different from each other.

According to this magnetoresistance effect device, since the resonance frequencies of the plurality of magnetization free layers are different from each other, the resonating frequency band is widened and the magnetoresistance effect device serves as a broadband band pass filter.

Further, the magnetoresistance effect device according to this aspect may further include a second electrode; and a third magnetoresistance effect element, wherein the third magnetoresistance effect element includes a third magnetization free layer, a third spacer layer, and a third magnetization fixed layer, wherein the third magnetization fixed layer is in electrical contact with the second electrode, wherein the first magnetization free layer, the metal layer, the third magnetization free layer, the third spacer layer, the third magnetization fixed layer, and the second electrode are disposed in this order, wherein the metal layer includes a third region which is overlapped with the third magnetization free layer when viewed from a lamination direction of the third magnetization free layer, wherein the metal layer is connected to the input terminal and the reference potential terminal so that a high-frequency signal flowing from the input terminal to the metal layer flows to the reference potential terminal through the third region, wherein the second electrode is connected to the output terminal, and wherein the third magnetoresistance effect element is provided with a part configured to apply a DC current or a DC voltage.

According to this magnetoresistance effect device, the spin-polarized spin current flows to the upper and lower surfaces of the metal layer due to the spin Hall effect. Since the spin currents flowing to the upper and lower surfaces are respectively injected to the first magnetization free layer and the third magnetization free layer, a higher AC signal is generated and the strength of the signal output from the magnetoresistance effect device is improved.

A magnetoresistance effect module according to a second aspect of the present invention includes the magnetoresistance effect device according to the first aspect and a DC current source or a DC voltage source is connected to the application terminal.

In the magnetoresistance effect module according to this aspect, a DC current or a DC voltage is applied to the magnetoresistance effect device so that the magnetoresistance effect module serves as a band pass filter or an amplifier.

A high-frequency filter according to a third aspect of the present invention uses the magnetoresistance effect device according to the first aspect.

In the magnetoresistance effect device according to this aspect, a relative angle between a magnetization direction of the first magnetization free layer and a direction of a high-frequency current flowing in the metal layer may be equal to or larger than 150° and equal to or smaller than 180° or may be equal to or larger than 0° and equal to or smaller than 30°.

In the magnetoresistance effect device according to this aspect, a relative angle between a magnetization direction of the first magnetization free layer and a magnetization direction of the first magnetization fixed layer may be equal to or larger than 90° and equal to or smaller than 150°.

A magnetoresistance effect device according to a fourth aspect of the present invention includes: a first magnetoresistance effect element which includes a first ferromagnetic layer, a second ferromagnetic layer, and a first spacer layer; a metal layer; a first electrode; an input terminal; an output terminal; and a reference potential terminal, wherein the first ferromagnetic layer, the first spacer layer, the second ferromagnetic layer, and the first electrode are disposed in this order, wherein the second ferromagnetic layer is in electrical contact with the first electrode and the first electrode is connected to the output terminal configured to output a high-frequency signal, wherein the metal layer is connected to the input terminal and the reference potential terminal so that a high-frequency signal flowing from the input terminal to the metal layer flows to the reference potential terminal and the first ferromagnetic layer is in electrical contact with the reference potential terminal, and wherein the first magnetoresistance effect element is provided with an application terminal configured to apply a DC current or a DC voltage.

According to this magnetoresistance effect device, in order to generate the spin torque resonance in the magnetoresistance effect element, an effect (an effect of a high-frequency SOT) in which a pure spin current of which a direction of a spin changes at a high frequency based on a spin Hall effect when a high-frequency current flows from the input terminal to the metal layer is applied as a spin orbit torque (SOT) to the magnetization of the ferromagnetic layer, an effect (an effect of a high-frequency magnetic field (an RF magnetic field)) in which a high-frequency magnetic field generated when the high-frequency current flows from the input terminal to the metal layer is applied to the magnetization of the ferromagnetic layer, an effect (an effect of a DC STT) in which a DC current or a DC voltage for extracting the oscillation of the resistance of the magnetoresistance effect element as the high-frequency signal from the output terminal is applied as spin transfer torque (STT) to the magnetization of the ferromagnetic layer, an effect (an effect of a high-frequency STT) in which the high-frequency current flows from the input terminal to the magnetoresistance effect element to be applied as spin transfer torque (STT) to the magnetization of the ferromagnetic layer, and an effect (an effect of a DC SOT) in which a DC current for extracting the oscillation of the resistance of the magnetoresistance effect element as the high-frequency signal from the output terminal flows to the metal layer and is applied as spin orbit torque (SOT) to the magnetization of the ferromagnetic layer can be used.

In the magnetoresistance effect device according to this aspect, an impedance between the input terminal and the output terminal may be higher than an impedance between the input terminal and the reference potential terminal.

In the magnetoresistance effect device according to this aspect, the first ferromagnetic layer may be electrically connected to the metal layer so that a high-frequency signal flows from the input terminal to the output terminal through the first magnetoresistance effect element and a resistance $R_{MTJ}$ of the first magnetoresistance effect element, a resistance $R_{lead}$ of the metal layer, and a characteristic impedance $Z_0$ may satisfy Equation (1).

[Math. 1]

$$38 \geq \frac{R_{MTJ}}{R_{lead}} + \frac{Z_0}{R_{lead}} + \frac{R_{MTJ}}{Z_0} \geq 18 \quad (1)$$

In the magnetoresistance effect device according to this aspect, the metal layer may include a first region which is overlapped with the first ferromagnetic layer when viewed from a lamination direction of the first ferromagnetic layer and in the high-frequency current flowing from the input terminal to the metal layer, a current density in a second region other than the first region in the magnetic layer may be larger than the current density of the first region.

In the magnetoresistance effect device according to this aspect, the metal layer may be connected to the reference potential terminal through a capacitor.

In the magnetoresistance effect device according to this aspect, the metal layer may include a first region which is overlapped with the first ferromagnetic layer when viewed from a lamination direction of the first ferromagnetic layer, the metal layer may be connected to the input terminal and the reference potential terminal so that a high-frequency signal flowing from the input terminal to the metal layer flows to the reference potential terminal through the first region, and a magnetization direction of the second ferromagnetic layer may be inclined by 90° in a counter-clockwise direction with respect to a direction in which the high-frequency current input from the input terminal flows to a connection point at which the metal layer is electrically connected to the capacitor.

The magnetoresistance effect device according to this aspect may further include a frequency setting unit which is able to change a resonance frequency of the first magnetoresistance effect element.

The magnetoresistance effect device according to this aspect may further include a second magnetoresistance effect element which includes a third ferromagnetic layer, a fourth ferromagnetic layer, and a second spacer layer, the metal layer, the third ferromagnetic layer, the second spacer layer, the fourth ferromagnetic layer, and the first electrode may be disposed in this order, the fourth ferromagnetic layer may electrically contact the first electrode, and the third ferromagnetic layer may electrically contact the reference potential terminal.

The magnetoresistance effect device according to this aspect may further include a second electrode; and a third magnetoresistance effect element, the third magnetoresistance effect element may include a fifth ferromagnetic layer, a third spacer layer, and a sixth ferromagnetic layer, the metal layer, the fifth ferromagnetic layer, the second spacer layer, the sixth ferromagnetic layer, and the second electrode may be disposed in this order, the sixth ferromagnetic layer may electrically contact the second electrode, the second electrode may be connected to the output terminal, and the third magnetoresistance effect element may be provided with a part configured to apply a DC current or a DC voltage.

In the magnetoresistance effect device according to this aspect, at least one of the resonance frequencies of the first ferromagnetic layer, the second ferromagnetic layer, the third ferromagnetic layer, the fourth ferromagnetic layer, the fifth ferromagnetic layer, and the sixth ferromagnetic layer may be different from the other resonance frequencies.

A high-frequency filter according to a fifth aspect of the present invention uses the magnetoresistance effect device according to the fourth aspect.

A magnetoresistance effect module according to a sixth aspect of the present invention includes: the magnetoresistance effect device according to the fourth aspect; and a DC current source or a DC voltage source, and the DC current source or the DC voltage source is connected to the application terminal.

Advantageous Effects of Invention

According to the present invention, a magnetoresistance effect device and a magnetoresistance effect module using a high-frequency spin orbit torque (SOT) resonance phenomenon can be used as a high-frequency filter or an amplifier.

According to the present invention, a magnetoresistance effect device and a magnetoresistance effect module using a high-frequency spin orbit torque (SOT) resonance phenomenon, a high-frequency magnetic field resonance phenomenon, a high-frequency spin transfer torque (STT) resonance phenomenon, a spin transfer torque (STT) based on a DC current, and a spin orbit torque (SOT) based on a DC current can be used as a high-frequency filter or an amplifier.

BRIEF DESCRIPTIONS OF THE DRAWINGS

Figure 5:
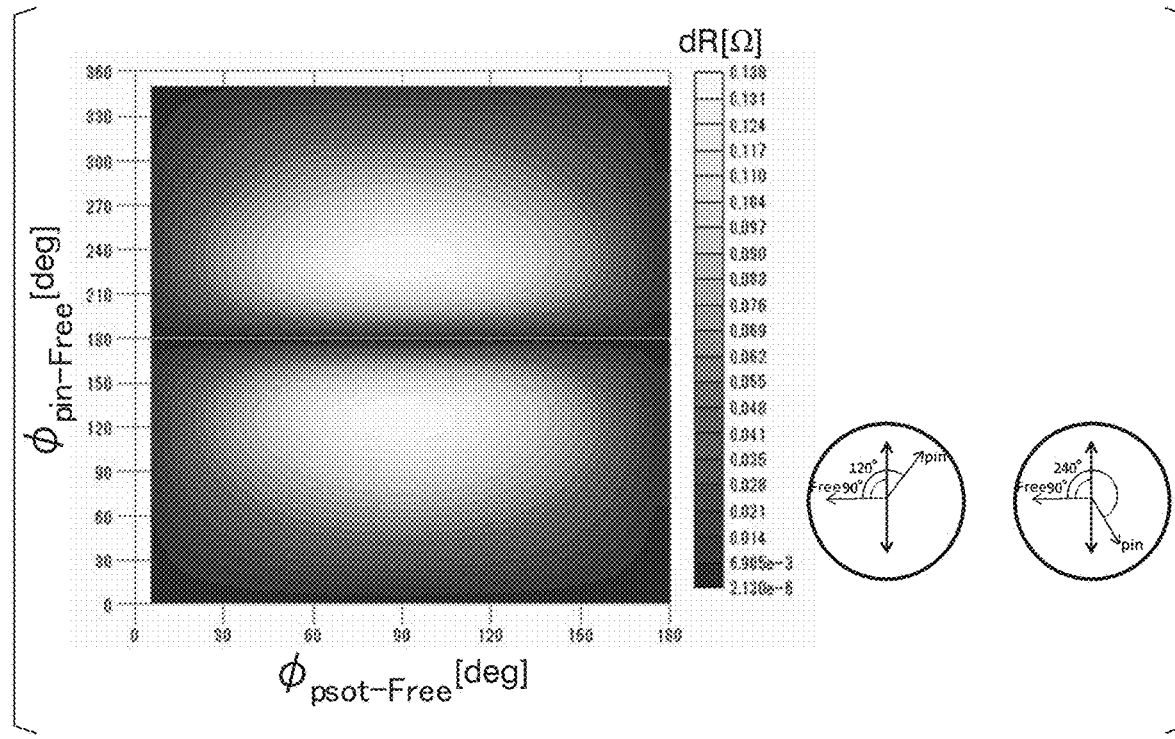

FIG. 5 is a result obtained by investigating the dependence of the magnitude of an oscillation of a resistance value of a magnetoresistance effect element on a relative angle between an SOT spin direction and a magnetization direction of a magnetization free layer and a relative angle between a magnetization direction of a magnetization fixed layer and the magnetization direction of the magnetization free layer when the magnetization fixed layer and the magnetization free layer have axes of easy magnetization in an in-plane direction of the film by LLG simulation.

Figure 6:
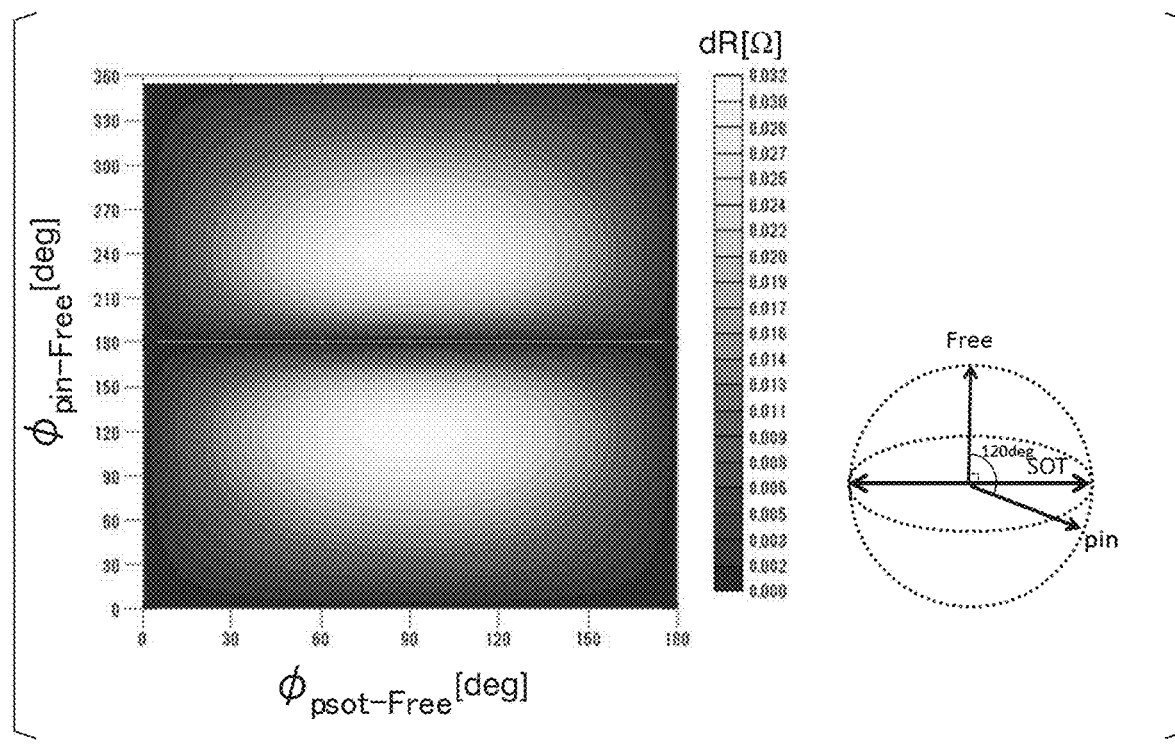

FIG. 6 is a result obtained by investigating the dependence of the magnitude of an oscillation of a resistance value of a magnetoresistance effect element on a relative angle between an SOT spin direction and a magnetization direction of a magnetization free layer and a relative angle between a magnetization direction of a magnetization fixed layer and the magnetization direction of the magnetization free layer when the magnetization fixed layer and the magnetization free layer have axes of easy magnetization in a direction perpendicular to a film surface by LLG simulation.

Figure 7:
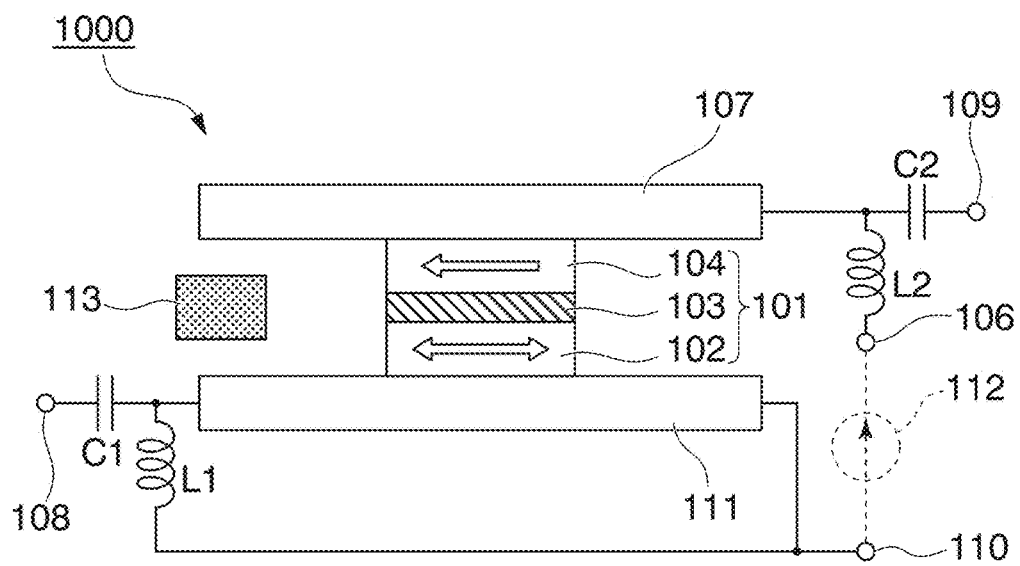

FIG. 7 is a schematic diagram of an example of a magnetoresistance effect device according to a fourth embodiment.

Figure 8:
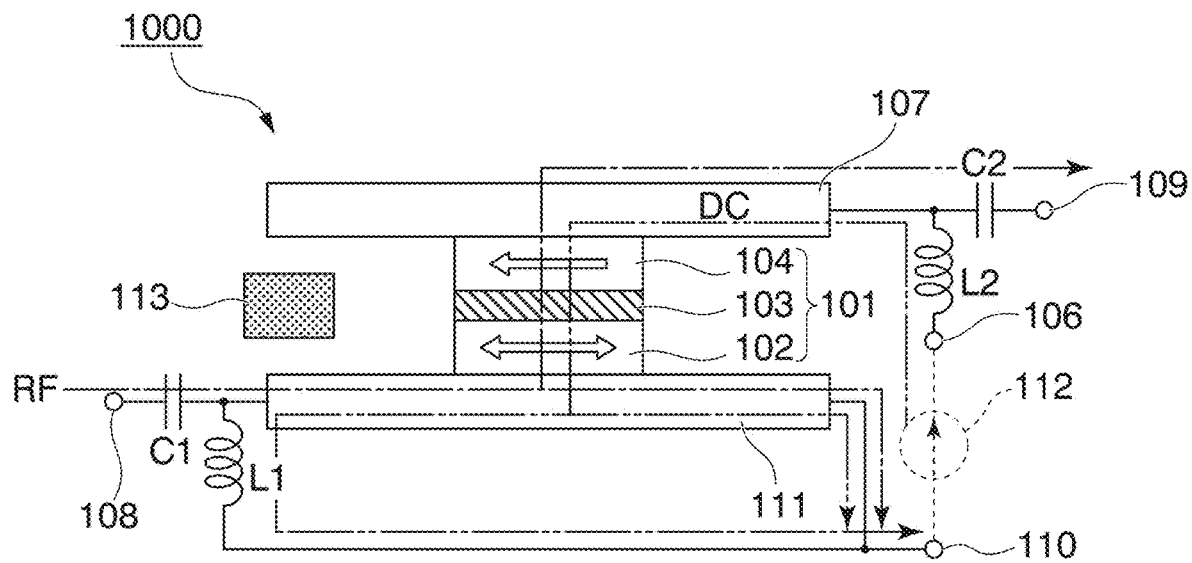

FIG. 8 is a schematic diagram showing a high-frequency current flow direction and a DC current flow direction in the magnetoresistance effect device in the example shown in FIG. 7.

Figure 9:
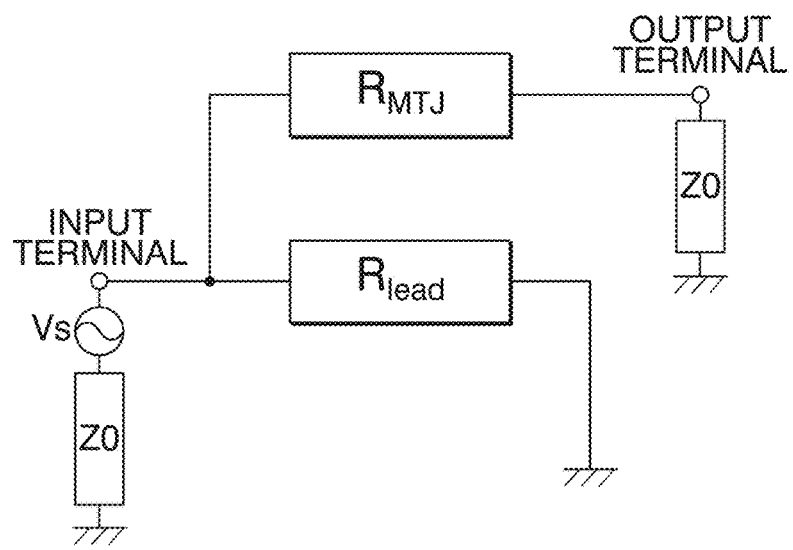

FIG. 9 is a simplified equivalent circuit of the magnetoresistance effect device.

Figure 10:
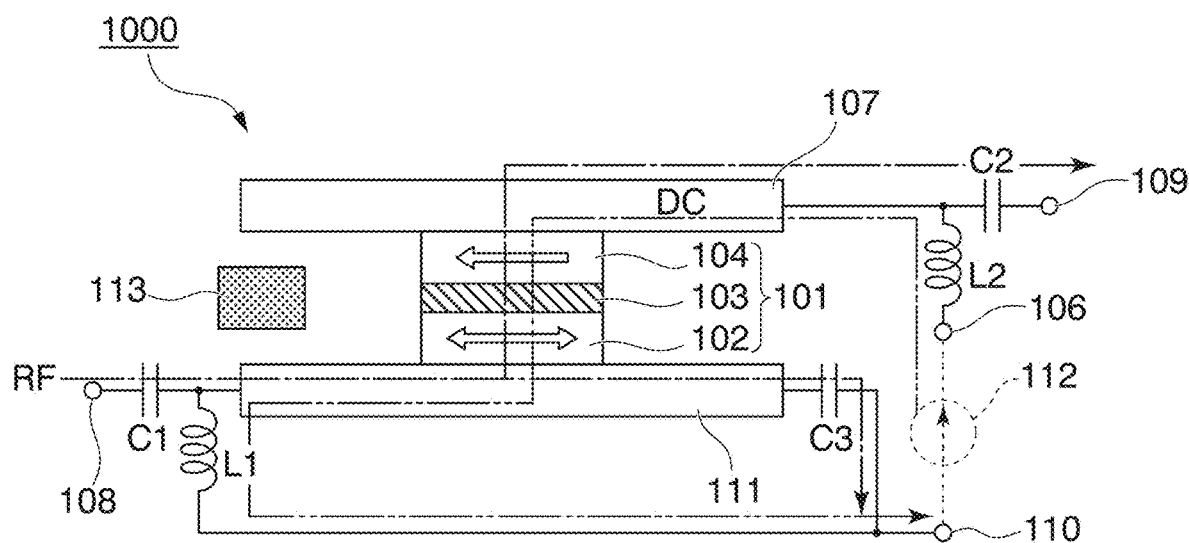

FIG. 10 is a schematic diagram of another example of the magnetoresistance effect device according to the fourth embodiment.

Figure 11:
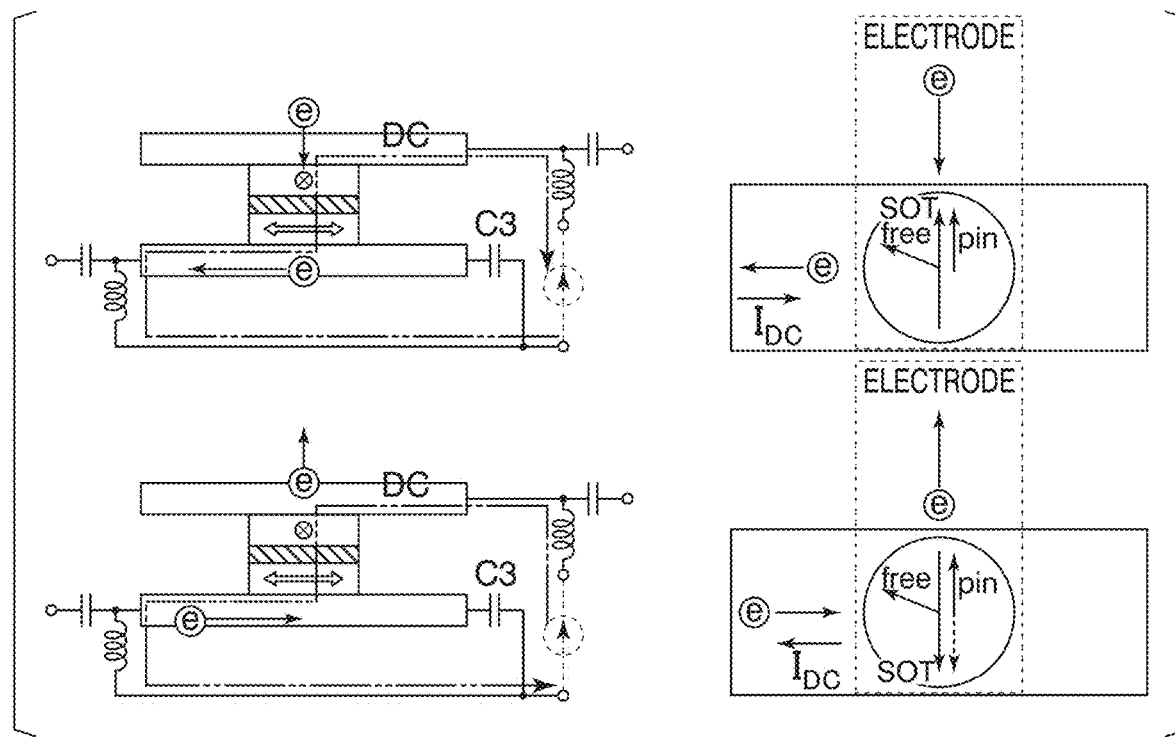

FIG. 11 is a schematic diagram showing a condition in which an STT effect due to a DC current and an SOT effect due to a DC current become strong in the magnetization of the magnetization free layer, where the upper half of FIG. 11 shows a case in which the DC current flows in the clockwise direction (a case in which the DC current flows from the magnetization free layer to the magnetization fixed layer) and the lower half of FIG. 11 shows a case in which the DC current flows in the counter-clockwise direction (a case in which the DC current flows from the magnetization fixed layer to the magnetization free layer).

Figure 12:
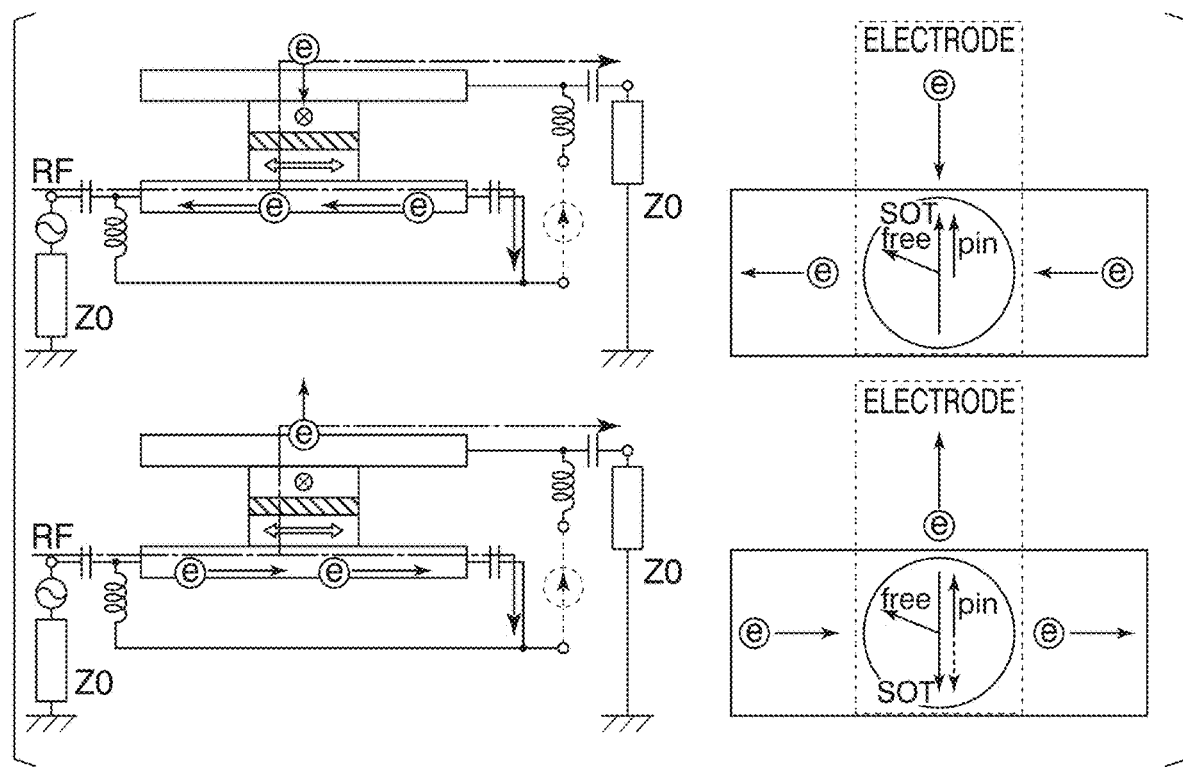

FIG. 12 is a schematic diagram showing a condition in which an STT effect due to a high-frequency current and an SOT effect due to a high-frequency current become strong in the magnetization of the magnetization free layer, where the upper half of FIG. 12 shows a case in which the high-frequency current instantly flows in the clockwise direction (the high-frequency current instantly flows from the magnetization free layer to the magnetization fixed layer) and the lower half of FIG. 12 shows a case in which the high-frequency current instantly flows in the counter-clockwise direction (the high-frequency current instantly flows from the magnetization fixed layer to the magnetization free layer).

Figure 13:
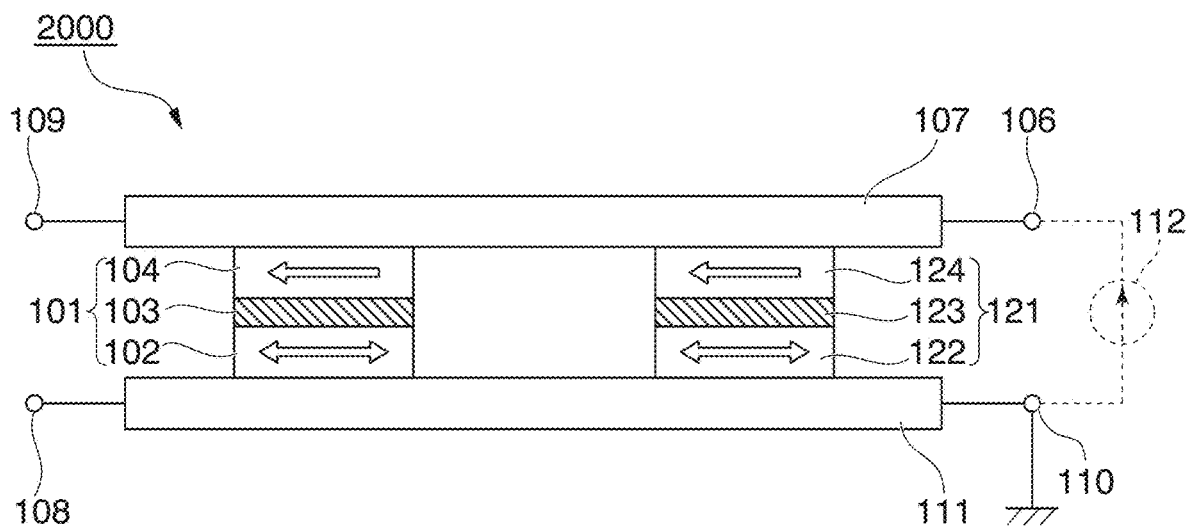

FIG. 13 is a schematic diagram of an example of a magnetoresistance effect device according to a fifth embodiment.

Figure 14:
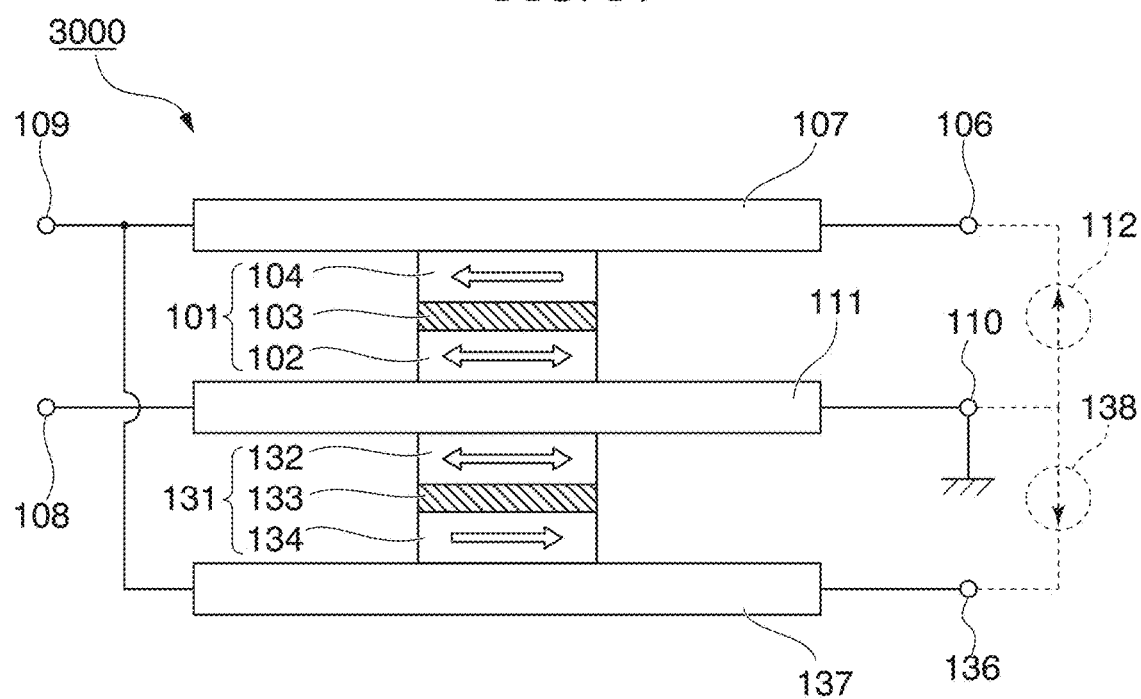

FIG. 14 is a schematic diagram of an example of a magnetoresistance effect device according to a sixth embodiment.

DESCRIPTION OF EMBODIMENTS

Hereinafter, a magnetoresistance effect device will be described in detail with reference to the drawings. In the drawings used in the following description, there is a case in which characteristic parts are enlarged for convenience in order to easily understand characteristics and the dimensional proportions of the components may be different from actual ones. The materials, dimensions, and the like in the following description are merely exemplary examples and the present invention is not limited thereto and can be realized while being appropriately changed within a range that exhibits the effects of the present invention.

First Embodiment

Figure 1:
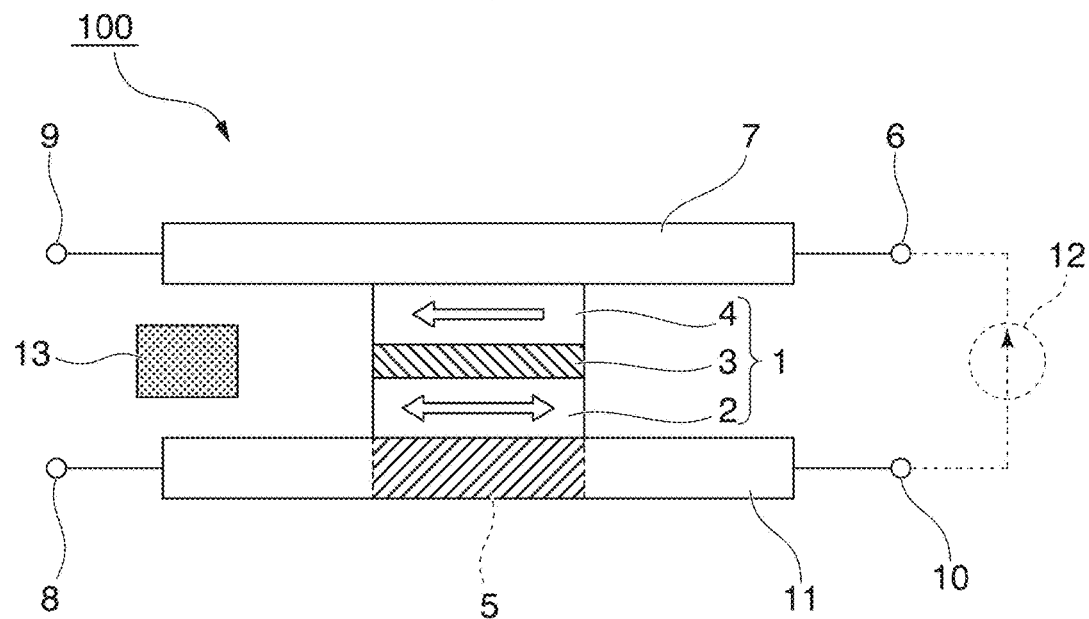
FIG. 1 is a schematic diagram of a magnetoresistance effect device according to a first embodiment.

FIG. 1 is a schematic diagram showing a circuit configuration of a magnetoresistance effect device according to a first embodiment. A magnetoresistance effect device 100 shown in FIG. 1 includes a magnetoresistance effect element (a first magnetoresistance effect element) 1, a metal layer 11, an electrode (a first electrode) 7, an input terminal 8, an output terminal 9, a reference potential terminal 10, and an application terminal 6. The magnetoresistance effect element 1 includes a magnetization free layer 2, a spacer layer 3, and a magnetization fixed layer 4.

<Magnetization Free Layer>

The magnetization free layer is formed such that its magnetization direction may be changed by an externally applied magnetic field or spin-polarized electrons and is formed of a ferromagnetic material. In the case of a material having an axis of easy magnetization in an in-plane direction of the film, CoFe, CoFeB, CoFeSi, CoMnGe, CoMnSi, or CoMnAl can be exemplified as the material of the magnetization free layer and a thickness of approximately 1 to 10 nm is desirable. In the case of a material having an axis of easy magnetization in a normal direction of the film surface (a direction perpendicular to the film surface), Co, a CoCr alloy, Co multilayer film, CoCrPt alloy, FePt alloy, a SmCo alloy including rare earth elements, or TbFeCo alloy can be exemplified as the material of the magnetization free layer. Further, the magnetization free layer may be formed of Heusler alloy. Further, a high spin polarization material may be inserted between the magnetization free layer and the spacer layer. Accordingly, a high rate of change of magnetoresistance can be obtained. As the high spin polarization material, a CoFe alloy and a CoFeB alloy are exemplary examples. A film thickness of a CoFe alloy or a CoFeB alloy is desirably 0.2 to 1.0 nm or so.

<Magnetization Fixed Layer>

The magnetization fixed layer is formed of a ferromagnetic material and the magnetization direction is substantially fixed to one direction. The magnetization fixed layer is desirably formed of a high spin polarization material such as Fe, Co, Ni, alloy of Ni and Fe, alloy of Fe and Co, or alloy of Fe, Co, and B. Accordingly, a high magnetoresistance change rate can be obtained. Further, the magnetization fixed layer may be formed of Heusler alloy. Further, the film thickness of the magnetization fixed layer is desirably 1 to 10 nm. Further, an antiferromagnetic layer may be added to be in contact with the magnetization fixed layer so that the magnetization of the magnetization fixed layer is fixed. Alternatively, a magnetization fixed layer, an intermediate layer, a ferromagnetic layer, and an antiferromagnetic layer may be disposed in this order to form a laminated structure and the magnetization of the magnetization fixed layer may be fixed by the RKKY interaction between the magnetization fixed layer and the ferromagnetic layer. Alternatively, the magnetization of the magnetization fixed layer may be fixed by using the magnetic anisotropy caused by a crystal structure, a form, or the like. For the antiferromagnetic layer, FeO, CoO, NiO, $CuFeS_2$, IrMn, FeMn, PtMn, Cr, or Mn can be used.

<Spacer Layer>

The spacer layer is disposed between the magnetization free layer and the magnetization fixed layer and can obtain a magnetoresistance effect by the interaction of the magnetization of the magnetization free layer and the magnetization of the magnetization fixed layer. The spacer layer is formed as a layer formed of a conductor, an insulator, and a semiconductor or a layer including an electrical conduction point formed by a conductor in an insulator.

When a nonmagnetic conductive material is used as the spacer layer, Cu, Ag, Au, or Ru can be exemplified as the material and a giant magnetoresistance (GMR: Giant Magnetoresistance) effect is exhibited in the magnetoresistance effect element. In the case of using a GMR effect, a film thickness of the spacer layer is desirably set to 0.5 to 3.0 nm or so.

When a nonmagnetic insulation material is applied as the spacer layer, $Al_2O_3$ or MgO are exemplary examples the material and a tunneling magnetoresistance (TMR: Tunneling Magnetoresistance) effect is exhibited in the magnetoresistance effect element. It is possible to obtain a high magnetoresistance change rate by adjusting the film thickness of the spacer layer to exhibit a coherent tunneling effect between the magnetization fixed layer and the magnetization free layer. In the case of using a TMR effect, the film thickness of the spacer layer is desirably set to 0.5 to 3.0 nm or so.

When a nonmagnetic semiconductor material is applied as the spacer layer, ZnO, $In_2O_3$, $SnO_2$, ITO, GaOx, or $Ga_2Ox$ can be exemplified as the material and the film thickness of the spacer layer is desirably set to 1.0 to 4.0 nm or so.

When a layer including a conduction point formed by a conductor in a nonmagnetic insulator is applied as the spacer layer, it is desirable to use a structure having a conduction point formed by a conductor such as CoFe, CoFeB, CoFeSi, CoMnGe, CoMnSi, CoMnAl, Fe, Co, Au, Cu, Al, or Mg in a nonmagnetic insulator formed of $Al_2O_3$ or MgO. In this case, the film thickness of the spacer layer is desirably set to 0.5 to 2.0 nm or so.

Further, a cap layer, a seed layer, or a buffer layer may be disposed between the electrode and the magnetoresistance effect element or between the metal layer 11 and the magnetoresistance effect element. As the cap layer, the seed layer, or the buffer layer, Ru, Ta, Cu, Cr, or a laminated film thereof can be exemplified and the film thickness of these layers is desirably set to 2 to 10 nm or so.

<Magnetoresistance Effect Element>

The size of the magnetoresistance effect element is desirably set such that a long side is set to 300 nm or less in the case of a rectangular shape (including a square shape) in a plan view. Further, when the shape in a plan view is not rectangular, the long side of a rectangle circumscribing a planar shape with the minimum area is defined as the long side of the magnetoresistance effect element. When the long side is as small as 100 nm or so, it is possible to realize a single magnetic domain from the magnetic domain of the magnetization free layer and thus to realize a highly efficient spin-torque resonance phenomenon. Here, the "shape in a plan view" indicates a shape which is viewed in a direction perpendicular to the lamination direction of the layers constituting the magnetoresistance effect element.

The magnetoresistance effect element includes the magnetization free layer, the magnetization fixed layer, and the spacer layer sandwiched between the magnetization free layer and the magnetization fixed layer.

The magnetization of the magnetization fixed layer is fixed to one direction. The magnetization direction of the magnetization free layer changes relative to the magnetization direction of the magnetization fixed layer to serve as the magnetoresistance effect element.

A high-frequency signal input from the input terminal 8 flows to the reference potential terminal 10 through a region (a first region) 5 of the metal layer 11.

<High-frequency Signal>

The high-frequency signal is a signal having a frequency component of 100 MHz or more. The power of the high-frequency signal is substantially in the range of −150 dBm to 40 dBm. The high-frequency signal is a modulated signal and is modulated by amplitude, frequency, phase, a combination of amplitude and phase, or the like.

<Electrode>

The electrode 7 and the metal layer 11 serve as a pair of electrodes and are disposed with the magnetoresistance effect element 1 interposed therebetween in the lamination direction of the layers constituting the magnetoresistance effect element 1. That is, the electrode 7 and the metal layer 11 serve as a pair of electrodes allowing a signal (a current) to flow in a direction intersecting the surface of each constituting layer in the magnetoresistance effect element 1, for example, a direction perpendicular to the surface of each constituting layer (a lamination direction). The electrode 7 is desirably formed as a film of Ta, Cu, Au, AuCu, Ru, or two or more of these materials.

<Terminal>

In the magnetoresistance effect element 1, one end (an end on the side of the magnetization free layer 2) is electrically connected to the input terminal 8 and the reference potential terminal 10 through the metal layer 11 and the other end (an end on the side of the magnetization fixed layer 4) is electrically connected to the output terminal 9 and the application terminal 6 through the electrode 7.

The electric connection is defined as below. When a potential difference occurs between the other end and the output terminal 9, a state in which a current flows to the other end and the output terminal 9 is defined as a state in which the other end and the output terminal 9 are electrically connected to each other. For example, even when an insulation material is disposed between the other end and the output terminal 9 or a spatial gap exists, the other end is electrically connected to the output terminal 9 when the thickness is very thin and a current flows between the other end and the output terminal 9.

<DC Current Source and Voltage Source>

When a DC current source 12 or a DC voltage source is connected to the application terminal 6, a DC current can be applied to the magnetoresistance effect element 1. Further, an inductor or a resistance element for cutting a high-frequency signal may be connected in series between the DC current input terminal 6 and the DC current source 12. Further, a capacitor which cuts a DC signal may be connected in series between the input terminal 8 and the electrode 7 and between the metal layer 11 and the output terminal 9 so that the DC current is efficiently applied from the DC current source 12 to the magnetoresistance effect element 1. The DC current source 12 may be configured as a circuit having a combination of a fixed resistance and a DC voltage source capable of generating a constant DC current. Further, a DC voltage may be applied to the magnetoresistance effect element 1 by being connected to a DC voltage source instead of the DC current source 12.

<Reference Potential Terminal>

The reference potential terminal 10 serves as a reference potential. For example, when the reference potential terminal 10 is connected to a ground, a reference potential is determined. The reference potential terminal 10 is connected to the metal layer 11.

The shapes of the electrode 7, the metal layer 11, and the reference potential terminal 10 are desirably defined in a microstrip line (MSL) type or a coplanar waveguide (CPW) type. In the case of the design of the microstrip line (MSL) type or the coplanar waveguide (CPW) type, it is desirable to design a signal line width and a distance between the grounds so that the characteristic impedance formed by the electrode 7, the metal layer 11, and the reference potential terminal 10 becomes the same as the impedance of the circuit system. With such a design, a transmission loss can be suppressed.

<Metal Layer>

The magnetoresistance effect element 1 is disposed on the metal layer 11 in order of the magnetization free layer 2, the spacer layer 3, and the magnetization fixed layer 4 to form a laminated structure. The metal layer 11 includes a region 5 which is overlapped with the magnetization free layer 2 when viewed from the lamination direction of the magnetization free layer 2.

Here, a spin orbit torque resonance will be described. When a high-frequency signal input from the input terminal 8 flows to the metal layer 11, a spin Hall effect is generated and a spin current (a pure spin current) which is a spin current not causing a spin-polarized current flows in a direction orthogonal to the flow direction of the high-frequency signal so that the spin current flows, for example, in the up and down directions from the metal layer 11 of FIG. 1. When the high-frequency signal flows to the region 5 of the metal layer 11, the pure spin current flowing upward is injected to the magnetization free layer 2.

The spin polarization direction of the spin current changes in the direction of the current. For example, when the DC current is applied from the input terminal 8 to the reference potential terminal 10, the spin current which is spin-polarized upward is injected to the magnetization free layer 2. Meanwhile, when the DC current is applied from the reference potential terminal 10 to the input terminal 8, the spin current which is spin-polarized downward is injected to the magnetization free layer 2.

The metal layer 11 may be directly connected to the magnetization free layer 2, but other layers may be disposed between the metal layer 11 and the magnetization free layer 2 as long as a pure spin current flows from the metal layer 11 to the magnetization free layer 2.

The metal layer 11 is formed of a material which generates a pure spin current by a spin Hall effect when a current flows thereto. As such a material, a material in which a spin current is generated in the metal layer 11 is enough. Thus, the material is not limited to a material including a single element and may include a part formed of a material generating the pure spin current and a part formed of a material not generating the pure spin current.

Further, the metal layer 11 may include a nonmagnetic heavy metal. The heavy metal includes heavy metal with large spin orbital interactions, for example, Hf, Ta, W, Re, Os, Ir, Pt, Pb, or alloy thereof. Further, as the heavy metal, a conductive material doped with these heavy metals or alloys may be used. Further, in order to obtain desired electric characteristics and structure, materials such as B, C, N, O, Al, Si, P, Ga, and Ge may be appropriately added to heavy metals. The metal layer 11 may include only nonmagnetic metal having a large atomic number of 39 or more and having d electrons or f electrons in the outermost shell.

Further, the metal layer 11 may include magnetic metal. The magnetic metal refers to ferromagnetic metal or antiferromagnetic metal. When a small amount of magnetic metal is included in the nonmagnetic metal, a spin orbit interaction is improved and hence the spin current generation efficiency for the current flowing to the metal layer 11 can be improved. The metal layer 11 may be formed of only the antiferromagnetic metal.

The spin-polarized spin current may change the magnetization direction of the magnetization free layer 2 while serving as spin orbit torque (Spin Orbit Torque: SOT) in the magnetization of the magnetization free layer 2. When the high-frequency signal flows to the metal layer 11, the direction of the spin injected to the magnetization free layer 2 changes at a high frequency so that the magnetization direction of the magnetization free layer 2 changes at a high frequency. When the magnetization of the magnetization free layer 2 strongly oscillates, the relative angle between the magnetization of the magnetization free layer 2 and the magnetization of the magnetization fixed layer 4 oscillates and the resistance value of the magnetoresistance effect element 1 oscillates at the same frequency as that of the high-frequency signal. The oscillating resistance becomes an AC signal due to a DC current or a DC voltage applied to the magnetoresistance effect element 1. For example, when the DC current is applied to the magnetoresistance effect element 1, the strength of the AC signal is expressed by the product of the oscillating resistance value and the value of the applied DC current. The AC signal is output to the output terminal 9.

At this time, when the frequency of the high-frequency signal is close to the resonance frequency of the magnetization free layer 2, the magnetization of the magnetization free layer 2 resonates with the high-frequency signal so that a strongly oscillating spin orbit torque resonance is generated. Since the magnetization of the magnetization free layer 2 strongly oscillates, a large AC signal is output to the output terminal 9.

Meanwhile, when the frequency of the high-frequency signal is far from the resonance frequency of the magnetoresistance effect element 1, the magnetization of the magnetization free layer 2 does not strongly oscillate by the spin orbit torque and hence the above-described large AC signal is not generated.

Thus, the magnetoresistance effect device 100 serves as a band pass filter which transmits a signal in the vicinity of the resonance frequency and attenuates a signal away from the resonance frequency.

The insertion loss of the band pass filter depends on the strength of the AC signal output from the magnetoresistance effect element 1 and the insertion loss decreases as the strength of the AC signal increases.

Further, when the strength of the AC signal output from the magnetoresistance effect element 1 is larger than the strength of the high-frequency signal input from the input terminal 8, the magnetoresistance effect device 100 serves as an amplifier which amplifies an input signal.

The DC current or the DC voltage applied to the magnetoresistance effect element 1 may serve as spin transfer torque in the magnetization of the magnetization free layer 2.

When the relative angle between the magnetization of the magnetization free layer 2 and the magnetization of the magnetization fixed layer 4 is substantially 90° or more, it is desirable to apply a current from the magnetization free layer 2 to the magnetization fixed layer 4. In this case, the spin transfer torque is operated to reduce the damping of the magnetization of the magnetization free layer 2 so that the oscillation of the magnetization of the magnetization free layer 2 increases.

Further, when the relative angle between the magnetization of the magnetization free layer 2 and the magnetization of the magnetization fixed layer 4 is substantially smaller than 90°, it is desirable to apply a current from the magnetization fixed layer 4 to the magnetization free layer 2. In this case, the spin transfer torque is operated to reduce the damping of the magnetization of the magnetization free layer 2 so that the oscillation of the magnetization of the magnetization free layer 2 increases.

Further, when the relative angle between the magnetization of the magnetization free layer 2 and the magnetization of the magnetization fixed layer 4 is substantially 90°, the magnitude of the oscillation of the resistance per unit magnetization amplitude becomes maximal.

<Magnetic Field Supply Mechanism (Unit)>

An external magnetic field may be applied to the magnetoresistance effect element 1 during the operation of the magnetoresistance effect device 100. That is, a magnetic field supply mechanism 13 which applies an external magnetic field to the magnetoresistance effect element 1 may be further provided. The magnetic field supply mechanism 13 causes a spin orbit torque resonance phenomenon in the magnetoresistance effect element 1 by applying the external magnetic field to the magnetoresistance effect element 1.

The magnetic field supply mechanism 13 is desirably disposed in the vicinity of the magnetoresistance effect element 1. The magnetic field supply mechanism 13 is formed in, for example, an electromagnet type or a strip line type variably controlling the applied magnetic field strength by a voltage or a current. Further, a combination of an electromagnet type or a strip line type capable of variably controlling the applied magnetic field strength and a permanent magnet supplying only a constant magnetic field may be used.

Further, in the magnetoresistance effect device 100 according to the embodiment, the impedance of the magnetoresistance effect element 1 may be larger than the impedance of the metal layer 11.

In order to allow the impedance of the magnetoresistance effect element 1 to be larger than the impedance of the metal layer 11, the area resistance of the magnetoresistance effect element 1 may be increased, the element size may be decreased, or the impedance of the magnetoresistance effect element 1 may be increased by using a nonmagnetic insulation material in the spacer layer 3.

Further, the impedance of the metal layer 11 may be decreased by increasing the film thickness of the metal layer 11 or increasing the area thereof.

Accordingly, since the high-frequency signal from the input terminal 8 flows from the metal layer 11 to the reference potential terminal 10 to a greater extent, the magnetoresistance effect device 100 has the following two effects.

Even when the high-frequency signal having a high strength is input to the magnetoresistance effect device 100, the magnetoresistance effect element 1 does not easily break. When the high-frequency signal is input to the magnetoresistance effect device 100, the high-frequency signal from the input terminal 8 flows to the reference potential terminal 10 to a greater extent in relation to the magnetoresistance effect element 1 so that a signal having a high strength hardly flows to the magnetoresistance effect element 1. Accordingly, the magnetoresistance effect element 1 does not easily break.

Further, since the high-frequency signal flows to the reference potential terminal 10 to a greater extent in relation to the magnetoresistance effect element 1, it is possible to improve the cutoff characteristic outside the band of the bandpass filter. When the frequency of the high-frequency signal is away from the resonance frequency of the magnetization free layer 2, the input high-frequency signal hardly flows to the magnetoresistance effect element 1. Accordingly, it is possible to decrease a signal output to the output terminal 9 and to improve the cutoff characteristic outside the band.

Further, the magnetoresistance effect device 100 according to the embodiment includes a frequency setting mechanism which changes the resonance frequency of the magnetization free layer 2.

<Frequency Setting Mechanism (Unit)>

The magnetic field supply mechanism 13 may be used as a frequency setting mechanism. The resonance frequency of the magnetization free layer 2 can be freely set by changing the frequency of the like of the external magnetic field supplied from the magnetic field supply mechanism 13. That is, the magnetic field supply mechanism 13 serves as the frequency setting mechanism.

The resonance frequency can be also changed by a method other than the external magnetic field. For example, the following method can be used.

As an example, an electric field may be applied to the magnetoresistance effect element 1 and the electric field may be changed. By changing the applied electric magnetic field, an anisotropic magnetic field Hk of the magnetization free layer 2 changes. As a result, since the effective magnetic field of the magnetization free layer 2 changes, the resonance frequency of the magnetization free layer 2 can be changed. In this case, a mechanism which applies an electric field to the magnetoresistance effect element 1 becomes the frequency setting mechanism (the effective magnetic field setting mechanism).

As another example, a piezoelectric body may be provided in the vicinity of the magnetization free layer 2. When an electric field is applied to the piezoelectric body, the piezoelectric body is deformed and the magnetization free layer 2 is distorted. As a result, since the anisotropic magnetic field Hk of the magnetization free layer 2 changes and the effective magnetic field of the magnetization free layer 2 changes, the resonance frequency of the magnetization free layer 2 can be changed. In this case, the piezoelectric body and the mechanism applying the electric field to the piezoelectric body correspond to the frequency setting mechanism (the effective magnetic field setting mechanism).

As another example, a control film corresponding to an antiferromagnetic body or a ferromagnetic body having an electromagnetic effect may be provided to be magnetically coupled to the magnetization free layer 2. When a magnetic field and an electric field are applied to the control film and at least one of the magnetic field and the electric field applied to the control film is changed, an exchange combined magnetic field HEX of the magnetization free layer 2 is changed. As a result, since the effective magnetic field of the magnetization free layer 2 changes, the resonance frequency of the magnetization free layer 2 can be changed. In this case, the mechanism which applies the magnetic field to the control film, the mechanism which applies the electric field to the control film, and the control film correspond to the frequency setting mechanism (the effective magnetic field setting mechanism).

In this way, the magnetoresistance effect device 100 includes the magnetoresistance effect element 1 which includes the magnetization free layer 2, the magnetization fixed layer 4, and the spacer layer 3, the metal layer 11, the electrode 7, the input terminal 8, the output terminal 9, and the reference potential terminal 10. Then, the metal layer 11, the magnetization free layer 2, the spacer layer 3, the magnetization fixed layer 4, and the electrode 7 are disposed in this order, the magnetization fixed layer 4 is in electrical contact with the electrode 7, the electrode 7 is connected to the output terminal 9 outputting the high-frequency signal, the metal layer 11 includes the region (the first region) 5 which is overlapped with the magnetization free layer 2 when viewed from the lamination direction of the magnetization free layer 2, and the metal layer 11 includes the application terminal 6 which is connected to the input terminal 8 and the reference potential terminal 10 so that a high-frequency signal flowing from the input terminal 8 to the metal layer 11 flows to the reference potential terminal 10 through the region 5 and applies a DC current or a DC voltage to the magnetoresistance effect element 1.

Thus, since a signal from the input terminal 8 flows to the region 5 of the metal layer 11 to generate a spin Hall effect, a spin-polarized spin current is injected to the magnetization free layer 2. The spin-polarized spin current acts as spin orbit torque in the magnetization of the magnetization free layer 2 and the magnetization direction of the magnetization free layer 2 changes. When the high-frequency signal flows to the metal layer 11, the direction of the spin injected to the magnetization free layer 2 changes at a high frequency. When the high-frequency signal has the same frequency as the resonance frequency of the magnetization free layer 2, the magnetization of the magnetization free layer 2 resonates and strongly oscillates. Since the magnetization of the magnetization free layer 2 strongly oscillates, the relative angle between the magnetization of the magnetization free layer 2 and the magnetization of the magnetization fixed layer 4 oscillates and the resistance value of the magnetoresistance effect element 1 oscillates at the same frequency as that of the high-frequency signal. The oscillating resistance becomes an AC signal due to the DC current or the DC voltage applied to the magnetoresistance effect element 1 and is output to the output terminal 9. When the high-frequency signal is a frequency away from the resonance frequency of the magnetoresistance effect element 1, the magnetization of the magnetization free layer 2 does not strongly oscillate due to the spin-polarized spin current and the above-described AC signal is not generated. That is, the magnetoresistance effect device 100 serves as a band pass filter which transmits a signal at the resonance frequency and attenuates a signal away from the resonance frequency.

Further, in the magnetoresistance effect device 100, the impedance of the magnetoresistance effect element 1 may be larger than the impedance of the metal layer 11.

In this case, since the high-frequency signal flows from the metal layer 11 to the reference potential terminal 10 to a greater extent, the magnetoresistance effect element 1 does not easily break even when the high-frequency signal having a high strength is input to the magnetoresistance effect device 100 and the magnetoresistance effect device 100 serves as a band pass filter according to a case in which input power is large.

Furthermore, since the high-frequency signal flows to the reference potential terminal 10 to a greater extent, the cutoff characteristics outside the band are improved.

Further, the magnetoresistance effect device 100 may further include a frequency setting mechanism which changes the resonance frequency of the magnetization free layer 2.

In this case, the resonance frequency of the magnetization free layer 2 can be changed and the magnetoresistance effect device 100 serves as a frequency variable band cutoff filter.

Second Embodiment

Figure 2:
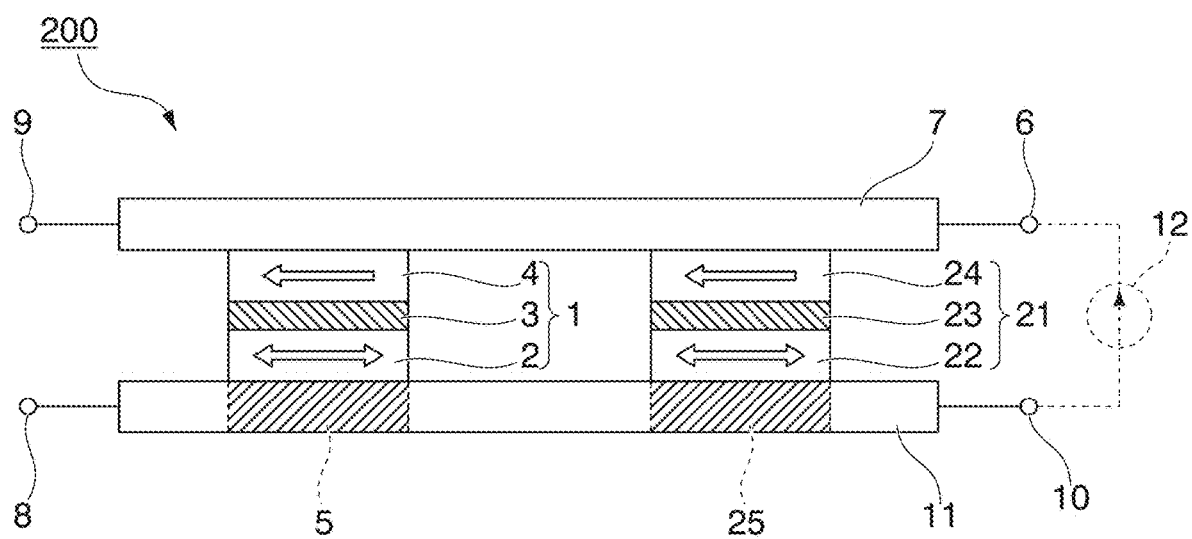
FIG. 2 is a schematic diagram of a magnetoresistance effect device according to a second embodiment.

FIG. 2 is a schematic diagram of a magnetoresistance effect device 200 according to a second embodiment of the present invention. In the magnetoresistance effect device 200, a point different from the magnetoresistance effect device 100 of the first embodiment will be mainly described and a description of common points will be appropriately omitted. The same reference numerals are used for the components common to the magnetoresistance effect device 100 of the first embodiment and a description of the common components will be omitted. The magnetoresistance effect device 200 further includes a second magnetoresistance effect element 21 in the magnetoresistance effect device 100 of the first embodiment. The second magnetoresistance effect element 21 includes a second magnetization free layer 22, a second spacer layer 23, and a second magnetization fixed layer 24. The other configurations of the magnetoresistance effect device 200 are the same as those of the magnetoresistance effect device 100 of the first embodiment.

The second magnetization free layer 22, the second spacer layer 23, the second magnetization fixed layer 24, and the electrode 7 are disposed on the metal layer 11 in this order to form a laminated structure. The metal layer 11 includes a second region 25 which is overlapped with the second magnetization free layer 22 when viewed from the lamination direction of the second magnetization free layer 22.

<Electrode>

The electrode 7 and the metal layer 11 serve as a pair of electrodes and are disposed with the second magnetoresistance effect element 21 interposed therebetween in the lamination direction of the layers constituting the second magnetoresistance effect element 21. That is, the electrode 7 and the metal layer 11 serve as a pair of electrodes allowing a signal (a current) to flow in a direction intersecting the surface of each constituting layer in the second magnetoresistance effect element 21, for example, a direction perpendicular to the surface of each constituting layer (the lamination direction).

<Terminal>

In the second magnetoresistance effect element 21, one end (an end on the side of the second magnetization free layer 22) is electrically connected to the input terminal 8 and the reference potential terminal 10 through the metal layer 11 and the other end (an end on the side of the second magnetization fixed layer 24) is electrically connected to the output terminal 9 and the application terminal 6 through the electrode 7. The metal layer 11 is connected to the input terminal 8 and the reference potential terminal 10 so that a high-frequency signal input from the input terminal 8 flows to the reference potential terminal 10 through the second region 25.

Similarly to the magnetoresistance effect element 1, when the high-frequency signal flows to the second region 25 in the second magnetoresistance effect element 21, the spin-polarized spin current is injected to the second magnetization free layer 22 so that the spin orbit torque resonance is generated, the resistance of the second magnetoresistance effect element 21 oscillates, and an AC signal is generated by a DC current or a DC voltage applied to the magnetoresistance effect element 21. Since the AC signal generated by the magnetoresistance effect element 1 and the second magnetoresistance effect element 21 is output to the output terminal 9, the strength of the signal output from the magnetoresistance effect device 200 is improved.

Further, in the magnetoresistance effect device 200 according to the embodiment, the resonance frequencies of the magnetization free layer 2 and the second magnetization free layer 22 may be different from each other.

The resonance frequency is changed by the effective magnetic field of each magnetization free layer. In order to set the resonance frequencies of the magnetization free layer 2 and the second magnetization free layer 22 to be different from each other, for example, the frequency setting mechanism can be used. The frequency setting mechanism is provided in one or both of the magnetoresistance effect element (the first magnetoresistance effect element) 1 and the second magnetoresistance effect element 21 and the effective magnetic fields are shifted to set the frequencies so that the resonance frequencies are different.

Alternatively, the resonance frequency may be changed by the element size of the magnetoresistance effect element. When the element size of the magnetoresistance effect element is changed, the shape magnetic anisotropy of the magnetization free layer changes and the effective magnetic field changes. For example, the element size of the second magnetoresistance effect element 21 can be set to be smaller than that of the magnetoresistance effect element 1 so that the resonance frequencies are set differently.

Since the resonance frequencies of the magnetization free layer 2 and the second magnetization free layer 22 are different from each other, the magnetization free layer 2 and the second magnetization free layer 22 strongly resonate at different frequencies with respect to the input high-frequency signal and output the AC signal to the output terminal 9 and hence the magnetoresistance effect device 200 serves as a broadband band pass filter.

In this way, the magnetoresistance effect device 200 includes the second magnetoresistance effect element 21, the second magnetoresistance effect element 21 includes the second magnetization free layer 22, the second spacer layer 23, and the second magnetization fixed layer 24, the metal layer 11, the second magnetization free layer 22, the second spacer layer 23, the second magnetization fixed layer 24, and the electrode 7 are disposed in this order, the metal layer 11 includes the second region 25 which is overlapped with the second magnetization free layer 22 when viewed from the lamination direction of the second magnetization free layer 22, and the metal layer 11 is connected to the input terminal 8 and the reference potential terminal 10 so that a high-frequency signal flowing from the input terminal 8 to the metal layer 11 flows to the reference potential terminal 10 through the second region 25.

Thus, since the magnetization free layers of the plurality of magnetoresistance effect elements are resonated by the high-frequency signal to generate a higher AC signal, the signal strength of the magnetoresistance effect device 200 is improved.

Further, in the magnetoresistance effect device 200, the resonance frequencies of the magnetization free layer 2 and the second magnetization free layer 22 may be different from each other.

In this case, since it is possible to widen the resonating frequency band, the magnetoresistance effect device 200 serves as a broadband band pass filter.

Third Embodiment

Figure 3:
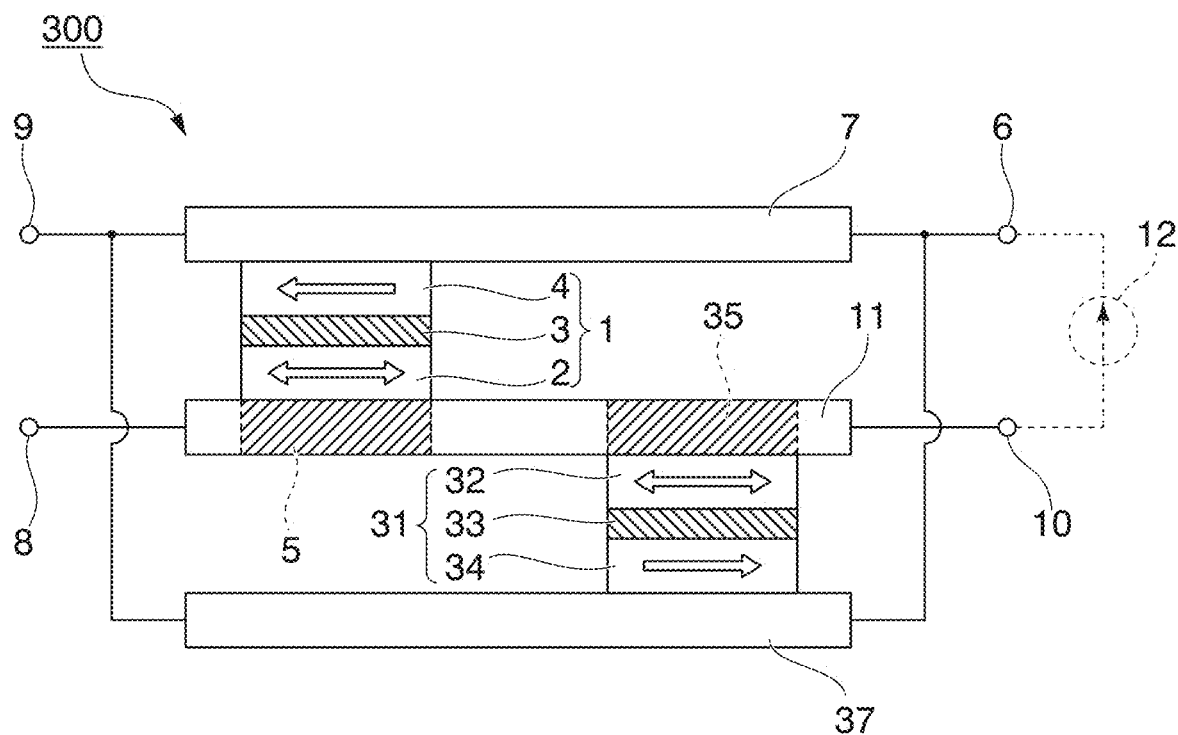
FIG. 3 is a schematic diagram of a magnetoresistance effect device according to a third embodiment.

FIG. 3 is a schematic diagram of a magnetoresistance effect device 300 according to a third embodiment of the present invention. In the magnetoresistance effect device 300, a point different from the magnetoresistance effect device 100 of the first embodiment will be mainly described and a description of common points will be appropriately omitted. The same reference numerals are used for the components common to the magnetoresistance effect device 100 of the first embodiment and a description of the common components will be omitted. The magnetoresistance effect device 300 further includes a third magnetoresistance effect element 31 and a second electrode 37 in the magnetoresistance effect device 100 of the first embodiment. The third magnetoresistance effect element 31 includes a third magnetization free layer 32, a third spacer layer 33, and a third magnetization fixed layer 34. The other configurations of the magnetoresistance effect device 300 are the same as those of the magnetoresistance effect device 100 of the first embodiment.

The magnetization free layer 2, the metal layer 11, the third magnetization free layer 32, the third spacer layer 33, the third magnetization fixed layer 34, and the second electrode 37 are disposed in this order to form a laminated structure. The metal layer 11 includes a third region 35 which is overlapped with the third magnetization free layer 32 when viewed from the lamination direction of the third magnetization free layer 32.

In the third magnetoresistance effect element 31, one end (an end on the side of the third magnetization free layer 32) is electrically connected to the input terminal 8 and the reference potential terminal 10 through the metal layer 11 and the other end (an end on the side of the third magnetization fixed layer 34) is electrically connected to the output terminal 9 and the application terminal 6 through the second electrode 37. The metal layer 11 is connected to the input terminal 8 and the reference potential terminal 10 so that a high-frequency signal input from the input terminal 8 flows to the reference potential terminal 10 through the third region 35.

In order to apply a DC current or a DC voltage to the third magnetoresistance effect element 31, the second electrode 37 is connected to the application terminal 6. The DC current source 12 is connected to the application terminal 6 so that a DC current is applied to the magnetoresistance effect element 1 and the third magnetoresistance effect element 31.

Figure 4:
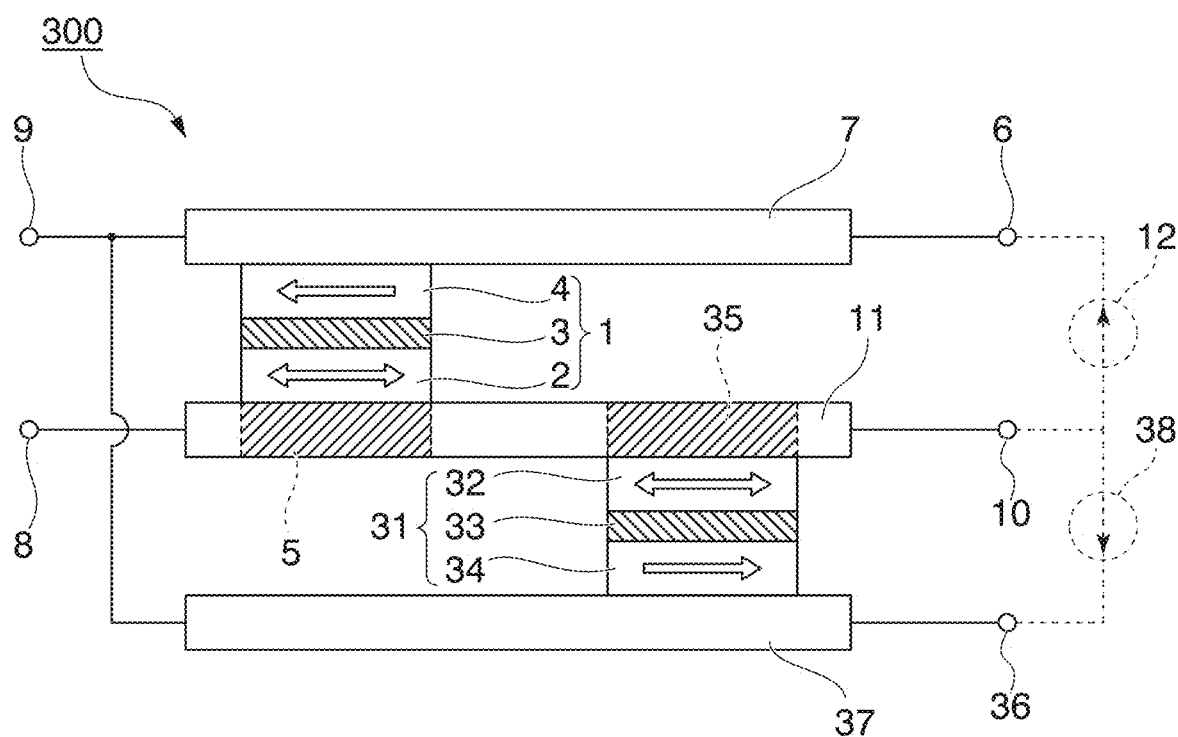
FIG. 4 is a schematic diagram of a modified example of the magnetoresistance effect device according to the third embodiment.

Meanwhile, in order to individually adjust a current value applied to the magnetoresistance effect element 1 and the third magnetoresistance effect element 31, as in FIG. 4, the magnetoresistance effect device 300 may further include a second application terminal 36 and the second electrode 37 may be connected to the second application terminal 36. It is possible to individually adjust the DC current applied to each magnetoresistance effect element by controlling each DC current source while the DC current source 12 is connected to the application terminal 6 and a second DC current source 38 is connected to the second application terminal 36. Further, it is possible to individually adjust the DC current applied to each magnetoresistance effect element by adjusting the resistance value of the variable resistance while the DC current source 12 is connected to the second application terminal 36 and the variable resistance is connected between the second application terminal 36 and the DC current source 12.

Further, a DC voltage may be applied to each magnetoresistance effect element by being connected to a DC voltage source instead of the DC current source.

When the high-frequency signal is input to the input terminal 8 of the magnetoresistance effect device 300, the high-frequency signal flows in the metal layer 11 and a spin Hall effect is generated in the region 5 and the third region 35. A spin-polarized spin current which flows upward in FIG. 3 in the region 5 is injected to the magnetization free layer 2 and a spin-polarized spin current which flows downward in the third region 35 is injected to the third magnetization free layer 32, so that spin orbit torque is applied to each magnetization free layer. Accordingly, since each of the magnetoresistance effect element 1 and the third magnetoresistance effect element 31 generates the AC signal and outputs the AC signal to the output terminal 9, the signal strength of the magnetoresistance effect device 300 is improved.

The region 5 may overlap the third region 35. The high-frequency signal input from the input terminal 8 generates a spin Hall effect in the metal layer 11 and a spin-polarized spin current flows upward and downward in FIG. 3 of the metal layer 11. For this reason, even when the region 5 and the third region 35 overlap each other, spin orbit torque can be effectively applied to the magnetization of the magnetization free layer 2 and the third magnetization free layer 32.

In this way, the magnetoresistance effect device 300 includes a third magnetoresistance effect element 31 and a second electrode 37, the third magnetoresistance effect element 31 includes a third magnetization free layer 32, a third spacer layer 33, and a third magnetization fixed layer 34, the magnetization free layer 2, the metal layer 11, the third magnetization free layer 32, the third spacer layer 33, the third magnetization fixed layer 34, and the second electrode 37 are disposed in this order, the metal layer 11 includes the third region 35 which is overlapped with the third magnetization free layer 32 when viewed from the lamination direction of the third magnetization free layer 32, the metal layer 11 is connected to the input terminal 8 and the reference potential terminal 10 so that a high-frequency signal flowing from the input terminal 8 to the metal layer 11 flows to the reference potential terminal 10 through the third region 35, the third magnetization fixed layer 34 is in electrical contact with the second electrode 37, the second electrode 37 is connected to the output terminal 9, and the third magnetoresistance effect element 31 is provided with a part applying a DC current or a DC voltage.

Thus, since a spin-polarized spin current flows to the upper and lower surfaces of the metal layer 11 by the spin Hall effect and the spin currents flowing to the upper and lower surfaces are respectively injected to the magnetization free layer of the magnetoresistance effect element, a higher AC signal is generated and hence the signal strength of the magnetoresistance effect device 300 is improved.

(Magnetoresistance Effect Module)

A magnetoresistance effect module of the present invention will be described. The magnetoresistance effect module includes the magnetoresistance effect device of at least one of the magnetoresistance effect devices of the first embodiment to the third embodiment and the DC current source. The DC current source is connected to the DC current application terminal so that the DC current is applied to the magnetoresistance effect element.

A DC voltage may be applied to the magnetoresistance effect element by being connected to a DC voltage source instead of the DC current source.

Further, the magnetoresistance effect module may include a plurality of DC current sources. For example, the magnetoresistance effect module includes the magnetoresistance effect device 300 of the third embodiment, the DC current source 12, and the second DC current source 38. Then, the DC current source 12 may be connected to the application terminal 6 and the second DC current source 38 may be connected to the second application terminal 36. Alternatively, the magnetoresistance effect module further includes the second DC current source 38. Then, the DC current source 12 may be connected to the DC current application terminal 6 and the second DC current source 38 may be connected to the second DC current application terminal 36.

Thus, the magnetoresistance effect module serves as a magnetoresistance effect module which has a function of a band pass filter or an amplifier by applying a DC current or a DC voltage to the magnetoresistance effect device.

FIG. 5 shows a result obtained by investigating dependence for a relative angle between the direction of spin (hereinafter, referred to as "SOT spin") of electrons of a pure spin current generated by the flow of the current in the metal layer and the magnetization direction of the magnetization free layer and a relative angle between the magnetization direction of the magnetization fixed layer and the magnetization direction of the magnetization free layer in the magnitude of the oscillation of the resistance value of the magnetoresistance effect element (the magnitude of the spin torque resonance) when the magnetization fixed layer and the magnetization free layer have axes of easy magnetization in an in-plane direction of the film surface by the LLG simulation.

In FIG. 5, the horizontal axis indicates the relative angle between the SOT spin direction and the magnetization direction of the magnetization free layer, the vertical axis indicates the relative angle between the magnetization direction of the magnetization fixed layer and the magnetization direction of the magnetization free layer, and the shade indicates the magnitude of the oscillation of the resistance value of the magnetoresistance effect element.

The simulation was performed by the following conditions.

Shape of magnetoresistance effect element: columnar shape of 120 nmφ

Thickness of magnetization free layer: 2 nm

Damping constant α: 0.02

Saturated magnetization Ms of magnetization free layer: $1.31 \times 10^6$ A/m

Perpendicular magnetic anisotropy magnetic field $H_u$ of magnetization free layer: $1.19 \times 10^6$ A/m External magnetic field of static magnetic field applied to magnetization free layer: 870 Oe Spin polarization P of magnetization fixed layer: 0.51

DC current applied to magnetoresistance effect element: $10^{-4}$ A

Pure spin current: $10^{-6}$ A

From the result shown in FIG. 5, it was found that the spin torque resonance was the largest when the relative angle between the SOT spin direction and the magnetization direction of the magnetization free layer was 90°. Further, it was found that the spin torque resonance was the largest when the relative angle between the magnetization direction of the magnetization fixed layer and the magnetization direction of the magnetization free layer was 120°.

FIG. 6 shows a result obtained by investigating dependence similar to FIG. 5 by using the LLG simulation also when the magnetization fixed layer and the magnetization free layer have axes of easy magnetization in a direction perpendicular to the film surface.

A simulation condition different from that of FIG. 5 is as follows.

Perpendicular magnetic anisotropy magnetic field Hu of magnetization free layer: $1.31 \times 10^6$ A/m External magnetic field of static magnetic field applied to magnetization free layer: 1000 Oe From the result shown in FIG. 6, it was found that the spin torque resonance was the largest when the relative angle between the SOT spin direction and the magnetization direction of the magnetization free layer was 90° and the spin torque resonance was the largest when the relative angle between the magnetization direction of the magnetization fixed layer and the magnetization direction of the magnetization free layer was 120° also when the magnetization fixed layer and the magnetization free layer have axes of easy magnetization in a direction perpendicular to the film surface.

From the result of FIGS. 5 and 6, it was found that the relative angle between the SOT spin direction and the magnetization direction of the magnetization free layer was desirably equal to or larger than 60° and equal to or smaller than 120° in order to exert stronger torque, largely vibrate the magnetization, and improve passage characteristics.

Since the direction of the high-frequency current flowing in the metal layer rotates by 90° from the SOT spin direction, a case in which the relative angle between the SOT spin direction and the magnetization direction of the magnetization free layer is equal to or larger than 60° and equal to or smaller than 120° corresponds to a case in which the relative angle between the direction of the high-frequency signal (the current) flowing in the metal layer and the magnetization direction of the magnetization free layer is equal to or larger than 150° and equal to or smaller than 180° or is equal to or larger than 0° and equal to or smaller than 30°.

From the result of FIGS. 5 and 6, it was found that the relative angle between the magnetization direction of the magnetization fixed layer and the magnetization direction of the magnetization free layer was desirably equal to or larger than 90° and equal to or smaller than 150° in order to allow the resonance strength to be stronger and improve the passage characteristics.

Fourth Embodiment

FIG. 7 is a schematic diagram showing an example of a circuit configuration of a magnetoresistance effect device according to a fourth embodiment.

A magnetoresistance effect device 1000 shown in FIG. 7 includes a first magnetoresistance effect element 101, a metal layer 111, a first electrode 107, an input terminal 108, an output terminal 109, a reference potential terminal 110, and an application terminal 106. The first magnetoresistance effect element 101 includes a first ferromagnetic layer 102, a first spacer layer 103, and a second ferromagnetic layer 104.

One of the first ferromagnetic layer and the second ferromagnetic layer may be the magnetization free layer or the other thereof may be the magnetization fixed layer. Alternatively, both layers may be the magnetization free layer. However, in the description below, a case in which the first ferromagnetic layer is the magnetization free layer and the second ferromagnetic layer is the magnetization fixed layer will be provided as an exemplary example.

In the magnetoresistance effect device 1000 shown in FIG. 7, the metal layer 111, the first ferromagnetic layer 102, the first spacer layer 103, the second ferromagnetic layer 104, and the first electrode 107 are disposed in this order. Further, the second ferromagnetic layer 104 is in electrical contact with the first electrode 107 and the first electrode 107 is connected to the output terminal 109 outputting a high-frequency signal. Further, the metal layer 111 is connected to the input terminal 108 and the reference potential terminal 110 so that a high-frequency signal flowing from the input terminal 108 connected to a high-frequency current applying unit (not shown) to the metal layer 111 flows to the reference potential terminal 110. Further, the first ferromagnetic layer 102 is in electrical contact with the reference potential terminal 110. Further, the first magnetoresistance effect element 101 is provided with the application terminal 106 configured to apply a DC current or a DC voltage. Reference Numeral 112 indicates a DC current source. Further, Reference Numeral 113 indicates a magnetic field application mechanism (a frequency setting mechanism).

In the magnetoresistance effect device 1000 shown in FIG. 7, since the high-frequency signal input from the input terminal 108 flows to the metal layer 111, a spin Hall effect is generated and a spin current (a pure spin current) which is a spin current not causing a spin-polarized current flows in a direction orthogonal to the flow direction of the high-frequency signal, for example, up and down directions from the metal layer 111 in FIG. 7. The pure spin current also has the same frequency as that of the high-frequency signal input from the input terminal 108. The pure spin current which flows upward is injected to the first ferromagnetic layer 102 which is the magnetization free layer.

When the high-frequency current flowing from the input terminal 108 to the metal layer 111 has the same frequency as the resonance frequency of the magnetization free layer of the first ferromagnetic layer 102 (and/or the second ferromagnetic layer 104), the magnetization of the first ferromagnetic layer 102 (and/or the second ferromagnetic layer 104) strongly oscillates due to the resonance. Since the resistance value of the first magnetoresistance effect element changes in accordance with the relative angle between the first ferromagnetic layer 102 and the second ferromagnetic layer 104, the magnetization strongly oscillates and hence the resistance value of the first magnetoresistance effect element 101 oscillates while changing largely. At this time, the resistance value of the first magnetoresistance effect element 101 oscillates at the same frequency as that of the high-frequency signal. The oscillating resistance value becomes the AC signal due to the DC current or voltage applied to the first magnetoresistance effect element and is output to the output terminal 109. When the frequency of the high-frequency signal is away from the resonance frequency, the magnetization does not strongly oscillate and the large AC signal is not generated. Further, since the high-frequency signal input from the input terminal to the magnetoresistance effect device flows to the reference potential terminal, the strength of the signal flowing to the output terminal decreases. Accordingly, the magnetoresistance effect device serves as a band pass filter which transmits a signal at the resonance frequency and attenuates a signal away from the resonance frequency.

Since the magnetic field caused by the current is applied to the magnetization of the first ferromagnetic layer 102 when the high-frequency signal flows to the metal layer, the effective magnetic field of the magnetization of the first ferromagnetic layer 102 changes at the high frequency to cause a ferromagnetic resonance in which the magnetization of the first ferromagnetic layer 102 oscillates. Accordingly, since a large current is output to the output terminal when the high-frequency signal input from the input terminal matches the resonance frequency of the magnetic layer 1, the passage characteristics of the filter are improved.

In the magnetoresistance effect device 1000 shown in FIG. 7, an example is shown in which a capacitor C1 is provided between the input terminal 108 and the metal layer 111, an inductor L1 is provided between: a point between the capacitor C1 and the metal layer 111; and the reference potential terminal 110, a capacitor C2 is provided between the first electrode 107 and the output terminal 109, and an inductor L2 is provided between: a point between the capacitor C2 and the first electrode 107; and the application terminal 106. The inductors L1 and L2 cut off the high frequency component of the current and allow only the passage of the DC component of the current. The capacitors C1 and C2 do not allow the passage of the DC component of the current and allow only the passage of the AC component.

By the configuration including the capacitor C1, the inductor L1, the capacitor C2, and the inductor L2, as shown in FIG. 8, the high-frequency current input from the input terminal 108 flows as indicated by the one-dotted chain line and the DC current applied from the DC current source 112 through the application terminal 106 flows as indicated by the two-dotted chain line.

Further, it is desirable that the impedance between the input terminal 108 and the output terminal 109 be higher than the impedance between the input terminal 108 and the reference potential terminal 110.

In this configuration, since the high-frequency signal from the input terminal easily flows to the reference potential terminal, the cut-off characteristics of the filter are improved.

Further, the first ferromagnetic layer 102 is desirably electrically connected to the metal layer 111 so that a high-frequency signal flows from the input terminal 108 to the output terminal 109 through the first magnetoresistance effect element 101 and the resistance $R_{MTJ}$ of the first magnetoresistance effect element 101, the resistance $R_{lead}$ of the metal layer 111, and the characteristic impedance $Z_0$ desirably satisfy Equation (1) below.

[Math. 2]

$$38 \geq \frac{R_{MTJ}}{R_{lead}} + \frac{Z_0}{R_{lead}} + \frac{R_{MTJ}}{Z_0} \geq 18 \quad (1)$$

Equation (1) can be obtained as follows.

A simplified equivalent circuit of the magnetoresistance effect device is shown as in FIG. 9. The resistance $R_{MTJ}$ of the first magnetoresistance effect element 101 is connected in series between the input terminal and the output terminal. Furthermore, one end of the resistance $R_{lead}$ of the metal layer 111 is connected between the input terminal and the resistance $R_{MTJ}$ of the first magnetoresistance effect element 101 and the other end of the resistance $R_{lead}$ of the metal layer 111 is grounded. The high-frequency signal source Vs and the resistance $Z_0$ corresponding to the characteristic impedance are connected to the input terminal and the resistance $Z_0$ corresponding to the characteristic impedance is connected to the output terminal. The transmission characteristic $S_{21}$ is calculated by Equation (2). From Equation (2), the value of Equation (3) may be 18 or more in order to obtain satisfactory cut-off characteristics in which $S_{21}$ is −20 dB or more.

[Math. 3]

$$S_{21} = \frac{Z_0}{2\left(Z_0 + \left(\frac{1}{R_{lead}} + \frac{1}{R_{MTJ} + Z_0}\right)^{-1}\right)^{-1} \left(\frac{1}{R_{lead}} + \frac{1}{R_{MTJ} + Z_0}\right)^{-1} \frac{Z_0}{R_{MTJ} + Z_0}} \quad (2)$$

[Math. 4]

$$\frac{R_{MTJ}}{R_{lead}} + \frac{Z_0}{R_{lead}} + \frac{R_{MTJ}}{Z_0} \quad (3)$$

Since the first ferromagnetic layer 102 (and/or the second ferromagnetic layer 104) generates a ferromagnetic resonance phenomenon due to the spin transfer torque when the pure spin current flows in the first magnetoresistance effect element 101 and a large AC current is output to the output terminal 109 when the high-frequency signal input from the input terminal 108 matches the resonance frequency of the first ferromagnetic layer 102 (and/or the second ferromagnetic layer 104), the passage characteristics are improved.

The resistance of the metal layer 111 can be adjusted by changing the thickness, width, or length of the metal layer or the material of the metal layer. For example, when the resistance of the metal layer is adjusted to decrease, the metal layer may be thinned or a material such as Au and Cu having low resistivity may be used. Meanwhile, when the resistance of the metal layer is adjusted to increase, the metal layer may be thickened or a material such as W and Ta having high resistivity may be used.

In order to further improve the passage characteristics of the filter, the high-frequency current input from the input terminal to the magnetoresistance effect device may flow more to the first magnetoresistance effect element 101. At this time, the larger spin transfer torque is applied to the magnetization of the first ferromagnetic layer 102, the magnetization is more strongly resonated, and the oscillating resistance component of the first magnetoresistance effect element 101 increases, so that the output is improved.

The value of Equation (3) may be small. Then, when the value is 38 or less, a current of 0.5 times or more of a maximum value flows and hence the improvement of the passage characteristics can be expected.

Further, the metal layer 111 includes the first region (see FIG. 1) which is overlapped with the first magnetization free layer 102 when viewed from the lamination direction of the first ferromagnetic layer 102. Then, in the high-frequency current flowing from the input terminal 108 to the metal layer 111, the current density of the second region other than the first region of the first ferromagnetic layer 102 is desirably larger than the current density of the first region, that is, the electric resistance of the second region is desirably smaller than that of the first region.

Since the current density of the high-frequency current flowing in the metal layer 111 is small in the first region as compared with the second region, the generation of heat in the first region is suppressed and the temperature of the magnetoresistance effect element at a direct upper position of the first region increases, it is possible to suppress deterioration of element characteristics.

Further, the metal layer 111 is desirably connected to the reference potential terminal 110 through a capacitor C3 (see FIG. 10)

Since the capacitor C3 is interposed between the metal layer 111 and the reference potential terminal 110, the DC current is not divided to the reference potential terminal 110 and the input terminal 108 and the DC current flows only to the input terminal 108, the SOT spin generated by the DC current is applied to the magnetization of the first ferromagnetic layer 102. Accordingly, it is possible to improve the resonance strength and to improve the signal strength.

Further, when the metal layer 111 is connected to the reference potential terminal 110 through the capacitor C3 (see FIG. 10), the metal layer 111 includes the first region which is overlapped with the first magnetization free layer 102 when viewed from the lamination direction of the first ferromagnetic layer 102, the metal layer 111 is connected to the input terminal 108 and the reference potential terminal 110 so that a high-frequency signal flowing from the input terminal 108 to the metal layer 111 flows to the reference potential terminal 110 through the first region, and the magnetization direction of the second ferromagnetic layer 104 is inclined by 90° in the counter-clockwise direction with respect to a direction in which the high-frequency current input from the input terminal 108 flows to the connection point at which the metal layer 111 is electrically connected to the capacitor C3.

With this configuration, the STT effect and the SOT effect become strong.

As for this reason, the DC current (DC component) will be described first with reference to FIG. 11. Next, the RF component will be described with reference to FIG. 12. Furthermore, in FIGS. 11 and 12, the reference numerals for the same components as those of FIG. 10 are omitted.

The upper half of FIG. 11 shows a case in which the DC current is applied from the first ferromagnetic layer 102 to the second ferromagnetic layer 104. In the upper half of FIG. 11, a left drawing is a cross-sectional view and a right drawing is a plan view.

Electrons flows in the first ferromagnetic layer 102 while passing through the second ferromagnetic layer 104. At that time, the spin polarized in the magnetization direction of the second ferromagnetic layer 104 is injected to the first ferromagnetic layer 102 and STT is applied to the magnetization of the first ferromagnetic layer 102 (DC STT effect).

Further, since the DC current flows to the metal layer 111, the spin polarized by the spin Hall effect is injected to the first ferromagnetic layer 102 and the torque generated by the spin orbital interactions is applied to the magnetization of the first ferromagnetic layer 102 (DC SOT effect).

A condition in which two torques become strong corresponds to a case in which the polarization directions are the same and a case in which the magnetization direction of the second ferromagnetic layer 104 is inclined by 90° in the counter-clockwise direction with respect to the direction of the DC current flowing in the metal layer 111.

The lower half of FIG. 11 shows a case in which the DC current is applied from the second ferromagnetic layer 104 to the first ferromagnetic layer 102. In the lower half of FIG. 11, the left drawing is a cross-sectional view and the right drawing is a plan view.

Electrons pass through the first ferromagnetic layer 102 and flow to the second ferromagnetic layer 104. At that time, the spin polarized in the magnetization direction of the second ferromagnetic layer 104 flows to the electrode, but the spin in a direction opposite to the magnetization direction of the second ferromagnetic layer 104 is reflected in the direction of the first ferromagnetic layer 102 and is injected to the first ferromagnetic layer 102 so that the STT is applied to the magnetization of the first ferromagnetic layer 102 (DC STT effect).

Further, since the DC current flows to the metal layer, the spin polarized by the spin Hall effect is injected to the first ferromagnetic layer 102 and the torque generated by the spin orbital interactions is applied to the magnetization of the first ferromagnetic layer 102 (DC SOT effect).

A condition in which two torques become strong corresponds to a case in which the polarization directions are the same and the magnetization direction of the second ferromagnetic layer 104 is inclined by 90° in the clockwise direction with respect to the direction of the DC current flowing to the metal layer.

The upper half of FIG. 12 shows a case in which electrons in the metal layer 111 instantly flow from the right to the left in the high-frequency current flowing from the input terminal 108 to the magnetoresistance effect device. In the upper half of FIG. 12, the left drawing is the cross-sectional view and the right drawing is a plan view.

At this time, electrons flow from the second ferromagnetic layer 104 toward the first ferromagnetic layer 102. At that time, the spin polarized in the magnetization direction of the second ferromagnetic layer 104 is injected to the first ferromagnetic layer 102 and the STT is applied to the magnetization of the first ferromagnetic layer 102 (an effect of the high-frequency STT).

Further, since electrons flow to the metal layer, the spin polarized by the spin Hall effect is injected to the first ferromagnetic layer 102 and the torque generated by the spin orbital interactions is applied to the magnetization of the first ferromagnetic layer 102 (an effect of the high-frequency SOT).

A condition in which two torques become strong corresponds to a case in which the polarization directions are the same and the magnetization direction of the second ferromagnetic layer 104 is inclined by 90° in the clockwise direction with respect to the diction of the electron flowing in the metal layer 111.

The lower half of FIG. 12 shows a case in which electrons instantly flow in the metal layer 111 from the left to the right in the high-frequency current flowing from the input terminal 108 to the magnetoresistance effect device. In the lower half of FIG. 12, the left drawing is a cross-sectional view and the right drawing is a plan view.

At this time, electrons pass through the first ferromagnetic layer 102 and flow to the second ferromagnetic layer 104. At that time, the spin polarized in the magnetization direction of the second ferromagnetic layer 104 flow to the electrode, but the spin in a direction opposite to the magnetization direction of the second ferromagnetic layer 104 is reflected in the direction of the first ferromagnetic layer 102 and is injected to the first ferromagnetic layer 102 and the STT is applied to the magnetization of the first ferromagnetic layer 102 (an effect of the high-frequency STT).

Further, since electrons flow to the metal layer 111, the spin polarized by the spin Hall effect is injected to the first ferromagnetic layer 102 and the torque generated by the spin orbital interactions is applied to the magnetization of the first ferromagnetic layer 102 (an effect of the high-frequency SOT).

A condition in which two torques become strong corresponds to a case in which the polarization directions are the same and the magnetization direction of the second ferromagnetic layer 104 is inclined by 90° in the counter-clockwise direction with respect to the direction of the electron flowing in the metal layer.

The frequency setting unit (mechanism) 113 capable of changing the resonance frequency of the first magnetoresistance effect element can be further provided.

Since the resonance frequency of the magnetization free layer is changed by the frequency setting unit, the magnetoresistance effect device serves as a frequency variable band cutoff filter.

Fifth Embodiment

FIG. 13 is a schematic diagram of a magnetoresistance effect device 2000 according to a fifth embodiment of the present invention. In the magnetoresistance effect device 2000, a point different from the magnetoresistance effect device 1000 of the fourth embodiment will be mainly described and a description of common points will be appropriately omitted. The same reference numerals are used for the components common to the magnetoresistance effect device 1000 of the fourth embodiment and a description of the common components will be omitted. The magnetoresistance effect device 2000 further includes a second magnetoresistance effect element 121 in the magnetoresistance effect device 1000 of the fourth embodiment. The second magnetoresistance effect element 121 includes a third ferromagnetic layer 122, a second spacer layer 123, and a fourth ferromagnetic layer 124. The other configurations of the magnetoresistance effect device 2000 are the same as those of the magnetoresistance effect device 1000 of the first embodiment.

One of the third ferromagnetic layer and the fourth ferromagnetic layer may be the magnetization free layer and the other thereof may be the magnetization fixed layer. Alternatively, both layers may be the magnetization free layer. However, in the description below, a case in which the third ferromagnetic layer is the magnetization free layer (the second magnetization free layer) and the fourth ferromagnetic layer is the magnetization fixed layer (the second magnetization fixed layer) will be described as an example.

The second magnetization free layer 122, the second spacer layer 123, the second magnetization fixed layer 124, and the first electrode 107 are disposed on the metal layer 111 in this order to form a laminated structure.

<Electrode>

The first electrode 107 and the metal layer 111 serve as a pair of electrodes and are disposed with a second magnetoresistance effect element 121 interposed therebetween in the lamination direction of each layer constituting the second magnetoresistance effect element 121. That is, the first electrode 107 and the metal layer 111 serve as a pair of electrodes allowing a signal (a current) to flow in a direction intersecting the surface of each constituting layer in the second magnetoresistance effect element 121, for example, a direction perpendicular to a surface of each constituting layer (the lamination direction).

<Terminal>

In the second magnetoresistance effect element 121, one end (an end on the side of the second magnetization free layer 122) is electrically connected to the input terminal 108 and the reference potential terminal 110 through the metal layer 111 and the other end (an end on the side of the second magnetization fixed layer 124) is electrically connected to the output terminal 9 and the application terminal 6 through the first electrode 107. The metal layer 111 is connected to the input terminal 108 and the reference potential terminal 110 so that a high-frequency signal input from the input terminal 108 flows to the reference potential terminal 110.

Similarly to the magnetoresistance effect element 1, when the high-frequency signal flows to the second magnetoresistance effect element 121, the spin-polarized spin current is injected to the second magnetization free layer 122 so that the spin orbit torque resonance is generated, the resistance of the second magnetoresistance effect element 121 oscillates, and the AC signal is generated by a DC current or a DC voltage applied to the second magnetoresistance effect element 121. Since the AC signal generated by the first magnetoresistance effect element 101 and the second magnetoresistance effect element 121 is output to the output terminal 109, the strength of the signal output from the magnetoresistance effect device 2000 is improved.

Further, in the magnetoresistance effect device 200 according to the embodiment, the resonance frequencies of the first magnetization free layer 102 and the second magnetization free layer 122 may be different from each other.

The resonance frequency is changed by the effective magnetic field of each magnetization free layer. In order to set the resonance frequencies of the first magnetization free layer 102 and the second magnetization free layer 122 to be different from each other, for example, the frequency setting mechanism can be used. The frequency setting mechanism is provided in one or both of the magnetoresistance effect element 1 and the second magnetoresistance effect element 121 and the effective magnetic fields are shifted to set the frequencies so that the resonance frequencies are different.

Alternatively, the resonance frequency may be changed by the element size of the magnetoresistance effect element. When the element size of the magnetoresistance effect element is changed, the shape magnetic anisotropy of the magnetization free layer changes and the effective magnetic field changes. For example, the element size of the second magnetoresistance effect element 121 can be set to be smaller than that of the magnetoresistance effect element 1 so that the resonance frequencies are set differently.

Since the resonance frequencies of the first magnetization free layer 102 and the second magnetization free layer 122 are different from each other, the first magnetization free layer 102 and the second magnetization free layer 122 strongly resonate at different frequencies with respect to the input high-frequency signal and output the AC signal to the output terminal 109 and hence the magnetoresistance effect device 2000 serves as a broadband band pass filter.

In this way, the magnetoresistance effect device 2000 includes the second magnetoresistance effect element 121, the second magnetoresistance effect element 121 includes the second magnetization free layer 122, the second spacer layer 123, and the second magnetization fixed layer 124, the metal layer 111, the second magnetization free layer 122, the second spacer layer 123, the second magnetization fixed layer 124, and the first electrode 107 are disposed in this order, the second magnetization fixed layer 124 is in electrical contact with the first electrode 107, and the second magnetization free layer 122 is electrically connected to the reference potential terminal 110.

Thus, since the magnetization free layers of the plurality of magnetoresistance effect elements are resonated by the high-frequency signal to generate a higher AC signal, the signal strength of the magnetoresistance effect device 2000 is improved.

Further, in the magnetoresistance effect device 2000, the resonance frequencies of the first magnetization free layer 102 and the second magnetization free layer 122 may be different from each other.

In this case, since it is possible to widen the resonating frequency band, the magnetoresistance effect device 2000 serves as a broadband band pass filter.

Sixth Embodiment

FIG. 14 is a schematic diagram of a magnetoresistance effect device 3000 according to a sixth embodiment of the present invention. In the magnetoresistance effect device 3000, a point different from the magnetoresistance effect device 1000 of the fourth embodiment will be mainly described and a description of common points will be appropriately omitted. The same reference numerals are used for the components common to the magnetoresistance effect device 1000 of the fourth embodiment and a description of the common components will be omitted. The magnetoresistance effect device 3000 further includes a third magnetoresistance effect element 131 and a second electrode 137 in the magnetoresistance effect device 1000 of the fourth embodiment. The third magnetoresistance effect element 131 includes a fifth ferromagnetic layer 32, a third spacer layer 33, and a sixth ferromagnetic layer 34. The other configurations of the magnetoresistance effect device 3000 are the same as those of the magnetoresistance effect device 1000 of the fourth embodiment.

One of the fifth ferromagnetic layer and the sixth ferromagnetic layer may be the magnetization free layer or the other thereof may be the magnetization fixed layer. Alternatively, both layers may be the magnetization free layer. However, in the description below, a case in which the fifth ferromagnetic layer is the magnetization free layer (the third magnetization free layer) and the sixth ferromagnetic layer is the magnetization fixed layer (the third magnetization fixed layer) will be described as an exemplary example.

The magnetization free layer 102, the metal layer 111, the third magnetization free layer 132, the third spacer layer 133, the third magnetization fixed layer 134, and the second electrode 137 are disposed in this order to form a laminated structure.

In the third magnetoresistance effect element 131, one end (an end on the side of the third magnetization free layer 132) is electrically connected to the input terminal 108 and the reference potential terminal 110 through the metal layer 111 and the other end (an end on the side of the third magnetization fixed layer 134) is electrically connected to the output terminal 109 and the application terminal 6 through the second electrode 137. The metal layer 111 is connected to the input terminal 108 and the reference potential terminal 110 so that a high-frequency signal input from the input terminal 108 flows to the reference potential terminal 110 through the third region 35.

In order to apply a DC current or a DC voltage to the third magnetoresistance effect element 131, the second electrode 137 is connected to an application terminal 136.

In order to individually adjust a current value applied to the magnetoresistance effect element 101 and the third magnetoresistance effect element 131, the magnetoresistance effect device 3000 may further include the second application terminal 136 and the second electrode 137 may be connected to the second application terminal 136. It is possible to individually adjust the DC current applied to each magnetoresistance effect element by controlling each DC current source while the DC current source 112 is connected to the application terminal 106 and the second DC current source 138 is connected to the second application terminal 136. Further, it is possible to individually adjust the DC current applied to each magnetoresistance effect element by adjusting the resistance value of the variable resistance while the DC current source 112 is connected to the second application terminal 136 and the variable resistance is connected between the second application terminal 136 and the DC current source 112.

Further, a DC voltage may be applied to each magnetoresistance effect element by being connected to a DC voltage source instead of the DC current source.

When the high-frequency signal is input to the input terminal 108 of the magnetoresistance effect device 3000, the high-frequency signal flows in the metal layer 111 and a spin Hall effect is generated. The spin-polarized spin current which flows upward in FIG. 14 is injected to the magnetization free layer 102 and the spin-polarized spin current which flows downward is injected to the third magnetization free layer 132, so that the spin orbit torque is applied to each magnetization free layer. Accordingly, since each of the magnetoresistance effect element 101 and the third magnetoresistance effect element 131 generates the AC signal and outputs the AC signal to the output terminal 109, the signal strength of the magnetoresistance effect device 3000 is improved.

The magnetoresistance effect element 101 and the third magnetoresistance effect element 131 are disposed at the overlapping position in the lamination direction, but may be offset from one another. Since the high-frequency signal input from the input terminal 108 generates the spin Hall effect in the metal layer 111 and the spin-polarized spin current flows upward and downward in FIG. 14 of the metal layer 111, the spin orbit torque can be effectively applied to the magnetization of the magnetization free layer 102 and the third magnetization free layer 132.

In this way, the magnetoresistance effect device 3000 includes the third magnetoresistance effect element 131 and the second electrode 137, the third magnetoresistance effect element 131 includes the third magnetization free layer 132, the third spacer layer 133, and the third magnetization fixed layer 134, the magnetization free layer 102, the metal layer 111, the third magnetization free layer 132, the third spacer layer 133, the third magnetization fixed layer 134, and the second electrode 137 are disposed in this order, the third magnetization fixed layer 134 is in electrical contact with the second electrode 137, the second electrode 137 is connected to the output terminal 109, and the third magnetoresistance effect element 131 is provided with a part applying a DC current or a DC voltage.

Thus, since the spin-polarized spin current flows to the upper and lower surfaces of the metal layer 111 by the spin Hall effect and the spin currents flowing to the upper and lower surfaces are respectively injected to the magnetization free layer of the magnetoresistance effect element, a higher AC signal is generated and hence the signal strength of the magnetoresistance effect device 3000 is improved.

In the magnetoresistance effect devices of the fourth embodiment to the sixth embodiment, at least one of the resonance frequencies of the plurality of ferromagnetic layers may be different from the other resonance frequencies.

In this case, since the resonance frequency of the ferromagnetic layer is different, it is possible to widen the resonating frequency band and to widen the passage band of the band pass filter.

The magnetoresistance effect devices and the magnetoresistance effect modules of the first embodiment to the sixth embodiment can be used as the high-frequency filter or the amplifier.

(Magnetoresistance Effect Module)

The magnetoresistance effect module of the present invention will be described. The magnetoresistance effect module includes the magnetoresistance effect device of at least one of the magnetoresistance effect devices of the fourth embodiment to the sixth embodiment and the DC current source. The DC current source is connected to the DC current application terminal to apply a DC current to the magnetoresistance effect element.

A DC voltage may be applied to the magnetoresistance effect element by being connected to a DC voltage source instead of the DC current source.

Further, the magnetoresistance effect module may include a plurality of DC current sources. For example, the magnetoresistance effect module may include the magnetoresistance effect device 3000 of the sixth embodiment, the DC current source 112, and the second DC current source 138, the DC current source 112 may be connected to the application terminal 106, and the second DC current source 138 may be connected to the second application terminal 136. Alternatively, the magnetoresistance effect module may further include the second DC current source 138, the DC current source 112 may be connected to the DC current application terminal 106, and the second DC current source 138 may be connected to the second DC current application terminal 136.

Thus, the magnetoresistance effect module serves as a magnetoresistance effect module having a function of a band pass filter or an amplifier by applying a DC current or a DC voltage to the magnetoresistance effect device.

REFERENCE SIGNS LIST

100 Magnetoresistance effect device
1 Magnetoresistance effect element
2 Magnetization free layer
3 Spacer layer
4 Magnetization fixed layer
5 Region
6 Application terminal
7 Electrode
8 Input terminal
9 Output terminal
10 Reference potential terminal
11 Metal layer
12 DC current source
13 Magnetic field application mechanism
200 Magnetoresistance effect device
21 Second magnetoresistance effect element
22 Second magnetization free layer
23 Second spacer layer
24 Second magnetization fixed layer
25 Second region
300 Magnetoresistance effect device
31 Third magnetoresistance effect element
32 Third magnetization free layer
33 Third spacer layer
34 Third magnetization fixed layer
35 Third region
36 Second application terminal
37 Second electrode
38 Second DC current source
1000 Magnetoresistance effect device
101 Magnetoresistance effect element
102 Magnetization free layer
103 Spacer layer
104 Magnetization fixed layer
106 Application terminal
107 Electrode
108 Input terminal
109 Output terminal
110 Reference potential terminal
111 Metal layer
112 DC current source
113 Magnetic field application mechanism
2000 Magnetoresistance effect device
121 Second magnetoresistance effect element
122 Second magnetization free layer
123 Second spacer layer
124 Second magnetization fixed layer
3000 Magnetoresistance effect device
131 Third magnetoresistance effect element
132 Third magnetization free layer
133 Third spacer layer
134 Third magnetization fixed layer
136 Second application terminal
137 Second electrode
138 Second DC current source

What is claimed is:

1. A magnetoresistance effect device comprising:
a first magnetoresistance effect element which includes a first magnetization free layer, a first magnetization fixed layer, and a first spacer layer;
a metal layer;
a first electrode;
an input terminal;
an output terminal; and
a reference potential terminal,
wherein the metal layer, the first magnetization free layer, the first spacer layer, the first magnetization fixed layer, and the first electrode are disposed in this order,
wherein the first magnetization fixed layer is in electrical contact with the first electrode,
wherein the first electrode is connected to the output terminal configured to output a high-frequency signal,
wherein the metal layer includes a first region which is overlapped with the first magnetization free layer when viewed from a lamination direction of the first magnetization free layer,
wherein the metal layer is connected to the input terminal and the reference potential terminal so that a high-frequency signal flowing from the input terminal to the metal layer flows to the reference potential terminal through the first region, and
wherein the first magnetoresistance effect element is provided with an application terminal configured to apply a DC current or a DC voltage.

2. The magnetoresistance effect device according to claim 1,
wherein an impedance of the first magnetoresistance effect element is higher than an impedance of the metal layer.

3. The magnetoresistance effect device according to claim 1, further comprising:
a frequency setting mechanism which is able to change a resonance frequency of the first magnetoresistance effect element.

4. The magnetoresistance effect device according to claim 1, further comprising:
a second magnetoresistance effect element,
wherein the second magnetoresistance effect element includes a second magnetization free layer, a second spacer layer, and a second magnetization fixed layer,
wherein the metal layer, the second magnetization free layer, the second spacer layer, the second magnetization fixed layer, and the first electrode are disposed in this order,
wherein the metal layer includes a second region which is overlapped with the second magnetization free layer when viewed from a lamination direction of the second magnetization free layer, and
wherein the metal layer is connected to the input terminal and the reference potential terminal so that a high-frequency signal flowing from the input terminal to the metal layer flows to the reference potential terminal through the second region.

5. The magnetoresistance effect device according to claim 4,
wherein the resonance frequencies of the first magnetization free layer and the second magnetization free layer are different from each other.

6. The magnetoresistance effect device according to claim 1, further comprising:
a second electrode; and
a third magnetoresistance effect element,
wherein the third magnetoresistance effect element includes a third magnetization free layer, a third spacer layer, and a third magnetization fixed layer, wherein the third magnetization fixed layer is in electrical contact with the second electrode, wherein the first magnetization free layer, the metal layer, the third magnetization free layer, the third spacer layer, the third magnetization fixed layer, and the second electrode are disposed in this order, wherein the metal layer includes a third region which is overlapped with the third magnetization free layer when viewed from a lamination direction of the third magnetization free layer, wherein the metal layer is connected to the input terminal and the reference potential terminal so that a high-frequency signal flowing from the input terminal to the metal layer flows to the reference potential terminal through the third region, wherein the second electrode is connected to the output terminal, and wherein the third magnetoresistance effect element is provided with a part configured to apply a DC current or a DC voltage.

7. A magnetoresistance effect module comprising:
the magnetoresistance effect device according to claim 1; and
a DC current source or a DC voltage source,
wherein the DC current source or the DC voltage source is connected to the application terminal.

8. A high-frequency filter that uses the magnetoresistance effect device according to claim 1.

9. The magnetoresistance effect device according to claim 1,
wherein a relative angle between a magnetization direction of the first magnetization free layer and a direction of a high-frequency current flowing in the metal layer is equal to or larger than 150° and equal to or smaller than 180° or is equal to or larger than 0° and equal to or smaller than 30°.

10. The magnetoresistance effect device according to claim 9,
wherein a relative angle between a magnetization direction of the first magnetization free layer and a magnetization direction of the first magnetization fixed layer is equal to or larger than 90° and equal to or smaller than 150°.

11. A magnetoresistance effect device comprising:
a first magnetoresistance effect element which includes a first ferromagnetic layer, a second ferromagnetic layer, and a first spacer layer;
a metal layer;
a first electrode;
an input terminal;
an output terminal; and
a reference potential terminal,
wherein the first ferromagnetic layer, the first spacer layer, the second ferromagnetic layer, and the first electrode are disposed in this order,
wherein the second ferromagnetic layer is in electrical contact with the first electrode and the first electrode is connected to the output terminal configured to output a high-frequency signal,
wherein the metal layer is connected to the input terminal and the reference potential terminal so that a high-frequency signal flowing from the input terminal to the metal layer flows to the reference potential terminal and the first ferromagnetic layer is in electrical contact with the reference potential terminal, and wherein the first magnetoresistance effect element is provided with an application terminal configured to apply a DC current or a DC voltage.

12. The magnetoresistance effect device according to claim 11,
wherein an impedance between the input terminal and the output terminal is higher than an impedance between the input terminal and the reference potential terminal.

13. The magnetoresistance effect device according to claim 11,
wherein the first ferromagnetic layer is electrically connected to the metal layer so that a high-frequency signal flows from the input terminal to the output terminal through the first magnetoresistance effect element and a resistance $R_{MTJ}$ of the first magnetoresistance effect element, a resistance $R_{lead}$ of the metal layer, and a characteristic impedance $Z_0$ satisfy Equation (1).

$$38 \geq \frac{R_{MTJ}}{R_{lead}} + \frac{Z_0}{R_{lead}} + \frac{R_{MTJ}}{Z_0} \geq 18 \qquad (1)$$

14. The magnetoresistance effect device according to claim 11,
wherein the metal layer includes a first region which is overlapped with the first ferromagnetic layer when viewed from a lamination direction of the first ferromagnetic layer, and
wherein in the high-frequency current flowing from the input terminal to the metal layer, a current density of a second region other than the first region in the magnetic layer is larger than a current density of the first region.

15. The magnetoresistance effect device according to claim 11,
wherein the metal layer is connected to the reference potential terminal through a capacitor.

16. The magnetoresistance effect device according to claim 15,
wherein the metal layer includes a first region which is overlapped with the first ferromagnetic layer when viewed from a lamination direction of the first ferromagnetic layer, and
wherein the metal layer is connected to the input terminal and the reference potential terminal so that a high-frequency signal flowing from the input terminal to the metal layer flows to the reference potential terminal through the first region and a magnetization direction of the second ferromagnetic layer is inclined by 90° in a counter-clockwise direction with respect to a direction in which the high-frequency current input from the input terminal flows to a connection point at which the metal layer is electrically connected to the capacitor.

17. The magnetoresistance effect device according to claim 11, further comprising:
a frequency setting unit which is able to change a resonance frequency of the first magnetoresistance effect element.

18. The magnetoresistance effect device according to claim 11, further comprising:
a second magnetoresistance effect element which includes a third ferromagnetic layer, a fourth ferromagnetic layer, and a second spacer layer,
wherein the metal layer, the third ferromagnetic layer, the second spacer layer, the fourth ferromagnetic layer, and the first electrode are disposed in this order, and wherein the fourth ferromagnetic layer is in electrical contact with the first electrode and the third ferromagnetic layer is in electrical contact with the reference potential terminal.

19. The magnetoresistance effect device according to claim 11, further comprising:
a second electrode; and
a third magnetoresistance effect element,
wherein the third magnetoresistance effect element includes a fifth ferromagnetic layer, a third spacer layer, and a sixth ferromagnetic layer,
wherein the metal layer, the fifth ferromagnetic layer, the second spacer layer, the sixth ferromagnetic layer, and the second electrode are disposed in this order,
wherein the sixth ferromagnetic layer is in electrical contact with the second electrode,
wherein the second electrode is connected to the output terminal, and
wherein the third magnetoresistance effect element is provided with a part configured to apply a DC current or a DC voltage.

20. The magnetoresistance effect device according to claim 18,
wherein at least one of the resonance frequencies of the first ferromagnetic layer, the second ferromagnetic layer, the third ferromagnetic layer, the fourth ferromagnetic layer, the fifth ferromagnetic layer, and the sixth ferromagnetic layer is different from the other resonance frequencies.

21. A high-frequency filter that uses the magnetoresistance effect device according to claim 11.

22. A magnetoresistance effect module comprising:
the magnetoresistance effect device according to claim 11; and
a DC current source or a DC voltage source,
wherein the DC current source or the DC voltage source is connected to the application terminal.

* * * * *